United States Patent
Lim et al.

(10) Patent No.: US 11,233,068 B2
(45) Date of Patent: Jan. 25, 2022

(54) NONVOLATILE MEMORY DEVICE HAVING A VERTICAL STRUCTURE AND A MEMORY SYSTEM INCLUDING THE SAME

(71) Applicant: SAMSUNG ELECTRONICS CO., LTD., Suwon-si (KR)

(72) Inventors: Bong-soon Lim, Seoul (KR); Jin-young Kim, Seoul (KR); Sang-won Shim, Seoul (KR); Il-han Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/193,187

(22) Filed: Mar. 5, 2021

(65) Prior Publication Data

US 2021/0193680 A1 Jun. 24, 2021

Related U.S. Application Data

(62) Division of application No. 16/861,939, filed on Apr. 29, 2020, now Pat. No. 10,978,481, which is a
(Continued)

(30) Foreign Application Priority Data

Nov. 27, 2017 (KR) .......................... 10-2017-0159694

(51) Int. Cl.
*G11C 11/34* (2006.01)
*H01L 27/11582* (2017.01)
(Continued)

(52) U.S. Cl.
CPC .... *H01L 27/11582* (2013.01); *G11C 16/0483* (2013.01); *G11C 16/08* (2013.01);
(Continued)

(58) Field of Classification Search
CPC .......... H01L 27/11582; H01L 23/5256; H01L 23/535; H01L 25/18; H01L 27/11565;
(Continued)

(56) References Cited

U.S. PATENT DOCUMENTS 8,107,312 B2 1/2012 Park et al.
8,811,079 B2 * 8/2014 Fukuda .................. G11C 14/00
365/185.08
(Continued)

OTHER PUBLICATIONS

U.S. Office Action Issued in Corresponding U.S. Appl. No. 17/073,653 dated Jul. 22, 2021.
(Continued)

*Primary Examiner* — Viet Q Nguyen
(74) *Attorney, Agent, or Firm* — F. Chau & Associates, LLC

(57) ABSTRACT

A nonvolatile memory device including: a first semiconductor layer including word lines, bit lines, first and second upper substrates adjacent to each other and a memory cell array, wherein the memory cell array includes a first vertical structure on the first upper substrate and a second vertical structure on the second upper substrate; and a second semiconductor layer under the first semiconductor layer, wherein the second semiconductor layer includes a lower substrate that includes row decoder and page buffer circuits, wherein the first vertical structure includes a first via area in which a first through-hole via is provided, wherein the first through-hole via passes through the first vertical structure and connects a first bit line and a first page buffer circuit, and the second vertical structure includes a first partial block, wherein the first partial block overlaps the first via area.

6 Claims, 19 Drawing Sheets

Related U.S. Application Data division of application No. 16/200,714, filed on Nov. 27, 2018, now Pat. No. 10,672,791.

(51) Int. Cl.

| | |
|---|---|
| *H01L 27/11573* | (2017.01) |
| *H01L 25/18* | (2006.01) |
| *H01L 23/535* | (2006.01) |
| *G11C 16/04* | (2006.01) |
| *H01L 23/522* | (2006.01) |
| *H01L 27/11565* | (2017.01) |
| *G11C 16/08* | (2006.01) |
| *H01L 27/11575* | (2017.01) |
| *H01L 27/1157* | (2017.01) |

(52) U.S. Cl.
CPC ........ *H01L 23/5226* (2013.01); *H01L 23/535* (2013.01); *H01L 25/18* (2013.01); *H01L 27/1157* (2013.01); *H01L 27/11565* (2013.01); *H01L 27/11573* (2013.01); *H01L 27/11575* (2013.01)

(58) Field of Classification Search
CPC ......... H01L 27/11573; H01L 27/11575; H01L 27/1157; G11C 16/0483; G11C 16/08
USPC .................................................... 365/185.12
See application file for complete search history.

(56) References Cited

U.S. PATENT DOCUMENTS

| | | | |
|---|---|---|---|
| 9,087,590 B2 | 7/2015 | Park et al. | |
| 9,218,882 B2 | 12/2015 | Fukuda | |
| 9,230,981 B2 | 1/2016 | Oh et al. | |
| 9,378,820 B2 | 6/2016 | Nam et al. | |
| 9,515,087 B2 | 12/2016 | Son et al. | |
| 9,595,346 B2 | 3/2017 | Lee et al. | |
| 9,646,981 B2* | 5/2017 | Nishikawa | G11C 16/0483 |
| 9,659,959 B2* | 5/2017 | Lee | H01L 29/40117 |
| 9,691,782 B1 | 6/2017 | Hwang et al. | |
| 9,698,151 B2* | 7/2017 | Lee | H01L 27/11565 |
| 9,716,181 B2 | 7/2017 | Nam et al. | |
| 9,721,663 B1 | 8/2017 | Ogawa et al. | |
| 9,941,009 B2* | 4/2018 | Lim | H01L 27/11573 |
| 10,446,575 B2 | 10/2019 | Kim et al. | |
| 10,510,407 B2 | 12/2019 | Laurent | |
| 10,529,727 B2* | 1/2020 | Park | H01L 27/11582 |
| 10,665,598 B2 | 5/2020 | Nagashima et al. | |
| 10,672,786 B2 | 6/2020 | Lee | |
| 10,672,791 B2* | 6/2020 | Lim | H01L 27/11575 |
| 10,777,571 B2 | 9/2020 | Jung et al. | |
| 10,978,465 B2 | 4/2021 | Lee et al. | |
| 10,978,481 B2* | 4/2021 | Lim | H01L 27/11582 |
| 11,024,638 B2 | 6/2021 | Shim et al. | |
| 2014/0036590 A1 | 2/2014 | Feeley et al. | |
| 2014/0061747 A1 | 3/2014 | Tanzawa et al. | |
| 2017/0179026 A1 | 6/2017 | Toyama et al. | |
| 2017/0207234 A1 | 7/2017 | Park et al. | |
| 2017/0236746 A1 | 8/2017 | Yu et al. | |
| 2017/0243650 A1 | 8/2017 | Ogawa et al. | |
| 2019/0164991 A1 | 5/2019 | Lim et al. | |
| 2020/0258911 A1 | 8/2020 | Lim et al. | |
| 2021/0098072 A1* | 4/2021 | Choi | G11C 29/76 |

OTHER PUBLICATIONS

German Office Action issued in corresponding German Application No. DE 102018129451.4 dated Sep. 1, 2020.

* cited by examiner

| Data | Number of the partial blocks |
|---|---|
| F/W | L |
| Debug | M |
| Security | N |
| Meta Reserved | P |
| GC Reserved | Q |

NONVOLATILE MEMORY DEVICE HAVING A VERTICAL STRUCTURE AND A MEMORY SYSTEM INCLUDING THE SAME

CROSS-REFERENCE TO RELATED APPLICATIONS

This application is a divisional of U.S. patent application Ser. No. 16/861,939 filed on Apr. 29, 2020, which is a divisional of U.S. patent application Ser. No. 16/200,714 filed on Nov. 27, 2018, now U.S. Pat. No. 10,672,791 issued on Jun. 2, 2020, which claims priority under 35 U.S.C. § 119 to Korean Patent Application No. 10-2017-0159694, filed on Nov. 27, 2017, in the Korean Intellectual Property Office, the disclosures of which are incorporated by reference herein in their entireties.

TECHNICAL FIELD

The inventive concept relates to a memory device, and more particularly, to a nonvolatile memory device having a vertical structure and a memory system including the same.

DISCUSSION OF RELATED ART

As information communication devices are being developed to have multitudes of functions, memories for such devices require a large capacity and a high degree of integration. As memory cell sizes decrease to achieve high integration, the complexity of the structures of operation circuits and/or wirings included in memory devices can degrade electrical characteristics. Accordingly, there exists a demand for memory devices having a high degree of integration and excellent electrical characteristics.

SUMMARY

According to an exemplary embodiment of the inventive concept, there is provided a nonvolatile memory device including: a first semiconductor layer comprising a plurality of word lines extending in a first direction, a plurality of bit lines extending in a second direction, first and second upper substrates adjacent to each other in the first direction and a memory cell array, wherein the memory cell array comprises a first vertical structure on the first upper substrate and a second vertical structure on the second upper substrate; and a second semiconductor layer under the first semiconductor layer in a third direction perpendicular to the first and second directions, wherein the second semiconductor layer comprises a lower substrate that comprises a plurality of row decoder circuits and a plurality of page buffer circuits, wherein the first vertical structure comprises a first via area in which a first through-hole via is provided, wherein the first through-hole via passes through the first vertical structure and connects a first bit line and a first page buffer circuit, and the second vertical structure comprises a first partial block, wherein the first partial block overlaps the first via area in the first direction.

According to an exemplary embodiment of the inventive concept, there is provided a nonvolatile memory device including: a first semiconductor layer comprising a first upper substrate and a second upper substrate adjacent to each other in a first direction and a memory cell array that comprises a plurality of memory blocks arranged in a second direction and first and second vertical structures, the first vertical structure comprising a plurality of first gate conductive layers stacked on the first upper substrate and a plurality of first pillars that pass through the first gate conductive layers and extend in a third direction perpendicular to the first and second directions, the second vertical structure comprising a plurality of second gate conductive layers stacked on the second upper substrate and a plurality of second pillars that pass through the second gate conductive layers and extend in the third direction; and a second semiconductor layer located under the first semiconductor layer in the third direction, wherein the second semiconductor layer comprises a lower substrate that comprises a plurality of row decoder circuits and a plurality of page buffer circuits, wherein the first vertical structure further comprises a first via area in which a first through-hole via passes through the first vertical structure and is connected to a first page buffer circuit, and a first partial block spaced apart from the first via area in the second direction, and the second vertical structure further comprises a second via area in which a second through-hole via passes through the second vertical structure and is connected to a second page buffer circuit, and a second partial block spaced apart from the second via area in the second direction.

According to an exemplary embodiment of the inventive concept, there is provided a nonvolatile memory device including: a first semiconductor layer comprising a first upper substrate and a second upper substrate that are adjacent to each other in a first direction and a memory cell array that comprises first and second vertical structures, the first and second vertical structures comprising a plurality of channel layers that vertically extend from the first and second upper substrates and first and second gate conductive layers that are respectively stacked on the first and second upper substrates along side walls of the plurality of channel layers; and a second semiconductor layer located under the first semiconductor layer in a vertical direction, the second semiconductor layer comprising a lower substrate that comprises a plurality of row decoder circuits and a plurality of page buffer circuits, wherein the first vertical structure further comprises a first through-hole via that passes through the first vertical structure and is connected to a first page buffer circuit, and the second vertical structure further comprises a first partial block, wherein the first partial block overlaps a first via area in the first direction and comprises an edge region electrically connected to a first row decoder circuit.

According to an exemplary embodiment of the inventive concept, there is provided a nonvolatile memory device including: a first semiconductor layer including a first vertical structure and a second vertical structure, each of the first and second vertical structures including gate conductive layers stacked in a first direction; and a second semiconductor layer disposed under the first semiconductor layer along the first direction, the second semiconductor layer including a row decoder disposed under the first vertical structure and a page buffer disposed under the second vertical structure, wherein the first vertical structure includes a plurality of first partial blocks and a plurality of first via areas, the second vertical structure includes a plurality of second partial blocks and a plurality of second via areas, and at least one of the first partial blocks overlaps at least one of the second via areas in a second direction substantially perpendicular to the first direction.

BRIEF DESCRIPTION OF THE DRAWINGS

The above and other features of the inventive concept will be more clearly understood by describing in detail exemplary embodiments thereof with reference to the accompanying drawings in which.

DETAILED DESCRIPTION OF THE EMBODIMENTS

Figure 1:
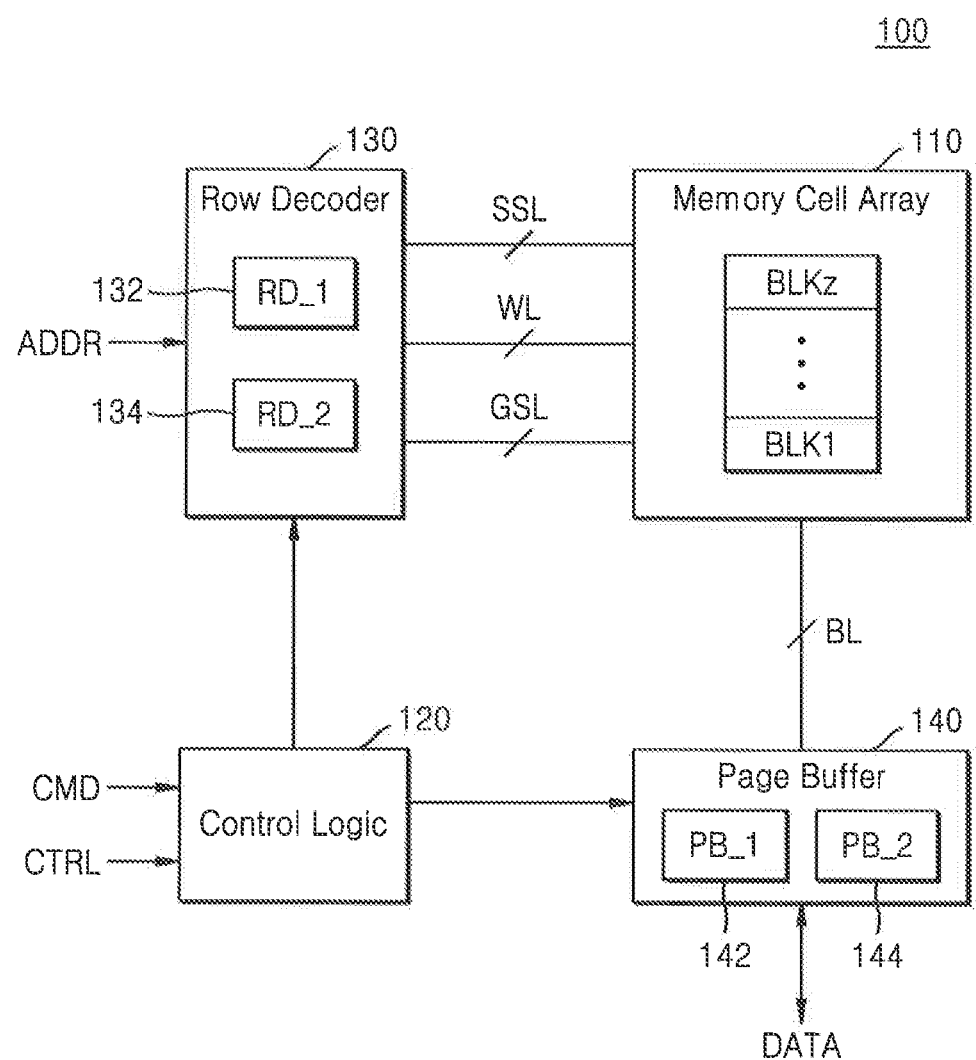
FIG. 1 is a block diagram of a memory device according to an exemplary embodiment of the inventive concept.

The inventive concept will now be described more fully with reference to the accompanying drawings, in which exemplary embodiments of the inventive concept are shown. In the drawings, like numerals may refer to like elements.

FIG. 1 is a block diagram of a memory device 100 according to an exemplary embodiment of the inventive concept.

Referring to FIG. 1, the memory device 100 may include a memory cell array 110, a control logic circuit 120, a row decoder 130, and a page buffer 140. The memory device 100 may further include a data input/output circuit or an input/output interface. In addition, the memory device 100 may further include various sub-circuits such as voltage generating circuit for generating various voltages used to operate the memory device 100 and an error correction circuit for correcting an error in data read from the memory cell array 110.

The memory cell array 110 may include a plurality of memory cells, and may be connected to string selection lines SSL, word lines WL, ground selection lines GSL, and bit lines BL. For example, the memory cell array 110 may be connected to the row decoder 130 through the string selection lines SSL, the word lines WL, and the ground selection lines GSL. The memory cell array 110 may be connected to the page buffer 140 through the bit lines BL.

For example, the plurality of memory cells included in the memory cell array 110 may be nonvolatile memory cells that retain data even when power is turned off. In other words, the memory cells may retain data in the absence of power. For example, when the memory cells are nonvolatile memory cells, the memory device 100 may be an electrically erasable programmable read-only memory (EEPROM), a flash memory, a phase-change random-access memory (PRAM), a resistive RAM (RRAM), a nano-floating gate memory (NFGM), a polymer RAM (PoRAM), a magnetic RAM (MRAM) or a ferroelectric RAM (FRAM). Although the embodiments to be described hereinafter are NAND flash memory cells, the inventive concept is not limited thereto.

The memory cell array 110 may include a plurality of memory blocks, e.g., first through $z^{th}$ memory blocks BLK1 through BLKz, and each memory block may have a planar structure or a three-dimensional (3D) structure. The memory cell array 110 may include a single-level cell block including single-level cells (SLC), a multi-level cell block including multi-level cells (MLC), a triple-level cell block including triple-level cells (TLC), or a quad-level cell block including quad-level cells (QLC). For example, some memory blocks from among the first through $z^{th}$ memory blocks BLK1 through BLKz may be single-level cell blocks, and other memory blocks may be multi-level cell blocks, triple-level cell blocks, or quad-level cell blocks.

In an exemplary embodiment of the inventive concept, the memory cell array 110 may include first and second vertical structures located on different upper substrates. For example, the first vertical structure may include one or more first via areas and one or more first partial blocks and the second vertical structure may include one or more second via areas and one or more second partial blocks. For example, in the first via area, one or more first through-hole vias that pass through the first vertical structure and are connected to a second page buffer 144 are formed. In addition, in the second via area, one or more through-hole vias that pass through the second vertical structure and are connected to a first page buffer 142 are formed. The through-hole vias of the first and second via areas are described below in detail.

The control logic circuit 120 may receive a command CMD and a control signal CTRL from the outside of the memory device 100. The control logic circuit 120 may control an overall operation of the memory device 100. For example, the control logic circuit 120 may control the memory device 100 to perform a memory operation corresponding to the command CMD applied from a memory controller. The control logic circuit 120 may generate various internal control signals used in the memory device 100 in response to the control signal CTRL applied from the memory controller. For example, the control logic circuit 120 may adjust a level of a voltage applied to the word lines WL, the bit lines BF, and the ground selection lines GSL during a memory operation such as a program operation or an erase operation.

In an exemplary embodiment of the inventive concept, when the memory cell array 110 includes a plurality of partial blocks, the control logic circuit 120 may control the row decoder 130 and the page buffer 140 to simultaneously access first and second partial blocks from among the partial blocks. In addition, the control logic circuit 120 may control the row decoder 130 and the page buffer 140 to independently access the first and second partial blocks. For example, the first and second partial blocks may be provided in different vertical structures. In this case, the first partial block may be accessed by a second row decoder 134 and the first page buffer 142 and the second partial block may be accessed by a first row decoder 132 and the second page buffer 144, as described below in detail.

The row decoder 130 may receive an address ADDR from the outside of the memory device 100. For example, the address ADDR may be applied from the memory controller. For example, the row decoder 110 may select at least one of the first through $z^{th}$ memory blocks BLK1 through BLKz in response to the address ADDR applied from the memory controller. The row decoder 130 may select at least one word line of the selected memory block in response to the address ADDR.

The row decoder 130 may apply a voltage for performing a memory operation to the selected word line of the selected memory block. For example, during a program operation, the row decoder 130 may apply a program voltage and a verify voltage to the selected word line and may apply a pass voltage to non-selected word lines. In addition, the row decoder 130 may select some of the string selection lines SSL in response to the address ADDR.

The row decoder 130 may include the first row decoder 132 and the second row decoder 134. For example, when the memory cell array 110 includes the first and second partial blocks in different vertical structures, the first row decoder 132 may be connected to the second partial block and the second row decoder 134 may be connected to the first partial block.

The page buffer 140 may transmit/receive data DATA to/from the outside of the memory device 100. The page buffer 140 may be connected to the memory cell array 110 through the bit lines BL. The page buffer 140 may operate as a write driver or a sense amplifier. For example, during a program operation, the page buffer 140 may operate as a write driver and may apply a voltage according to the data DATA to be stored in the memory cell array 110 to the bit lines BL. During a read operation, the page buffer 140 may operate as a sense amplifier and may sense the data DATA stored in the memory cell array 110.

The page buffer 140 may include the first page buffer 142 and the second page buffer 144. For example, when the memory cell array 110 includes the first and second partial blocks in different vertical structures, the first page buffer 142 may be connected to the first partial block and the second page buffer 144 may be connected to the second partial block.

Figure 2:
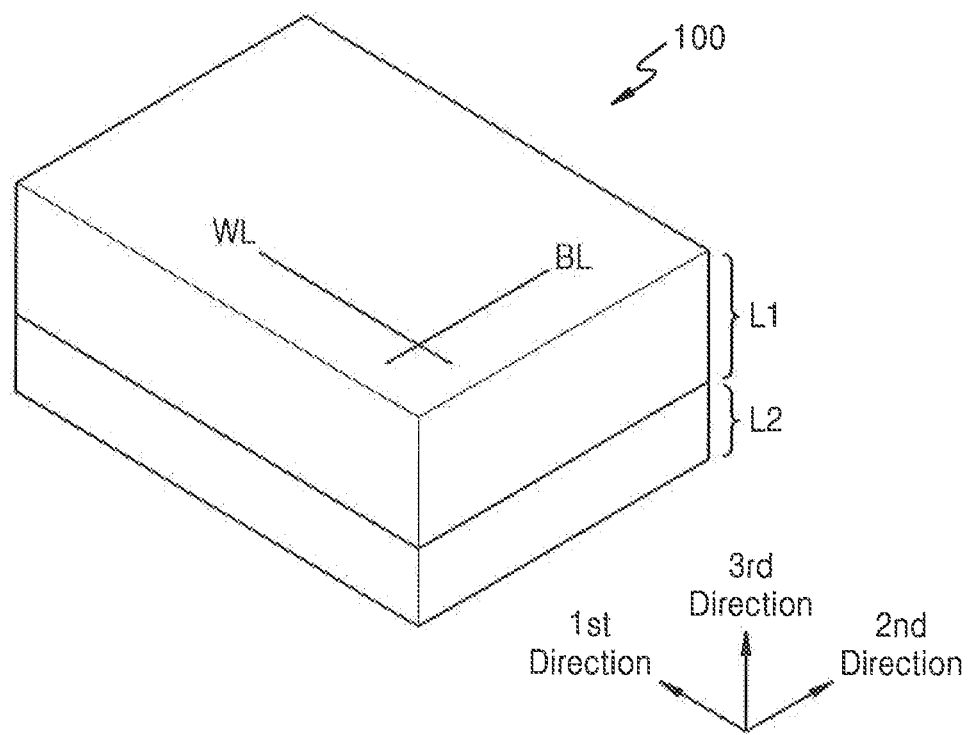
FIG. 2 is a view illustrating a structure of a memory device according to an exemplary embodiment of the inventive concept.

FIG. 2 is a view illustrating a structure of a memory device according to an exemplary embodiment of the inventive concept. For example, FIG. 2 may illustrate a structure of the memory device 100 of FIG. 1. The following will be described with reference to FIG. 1.

Referring to FIG. 2, the memory device 100 may include a first semiconductor layer L1 and a second semiconductor layer L2. The first semiconductor layer L1 may be stacked on the second semiconductor layer L2 in a third direction, in an exemplary embodiment of the inventive concept, the memory cell array 110 may be formed on the first semiconductor layer L1, and at least one from among the control logic circuit 120, the row decoder 130, and the page buffer 140 may be formed on the second semiconductor layer L2. For example, various circuits may be formed on the second semiconductor layer L2 by forming semiconductor elements such as transistors and patterns for wiring the semiconductor elements on a lower substrate of the second semiconductor layer L2.

After the circuits are formed on the second semiconductor layer L2, the first semiconductor layer L1 including the memory cell array 110 may be formed. For example, the first semiconductor layer L1 may include a plurality of upper substrates. The memory cell array 110 may be formed on the first semiconductor layer L1 by forming a plurality of gate conductive layers stacked on each of the upper substrates and a plurality of pillars that pass through the plurality of gate conductive layers and extend in a vertical direction (e.g., the third direction) perpendicular to a top surface of each of the upper substrates. In addition, patterns for electrically connecting the memory cell array 110 (e.g., the word lines WL and the bit lines BL) and the circuits formed on the second semiconductor layer L2 may be formed on the first semiconductor layer L1. For example, the word lines WL may extend in a first direction and may be arranged in a second direction. In addition, the bit lines BL may extend in the second direction and may be arranged in the first direction.

Accordingly, the memory device 100 may have a cell-on-pen or cell-over-peri (COP) structure in which the control logic circuit 120, the row decoder 130, the page buffer 140, or various other peripheral circuits and the memory cell array 110 are arranged in a stacked direction (e.g., the third direction). Since, for example, circuits are located under the memory cell array 110, the COP structure may reduce an area on a surface perpendicular to the stacked direction, and thus, the number of memory cells integrated in the memory device 100 may be increased.

In addition, a plurality of pads for electrical connection to the outside of the memory device 100 may be provided. For example, a plurality of pads for receiving the command CMD, the address ADDR, and the control signal CTRL from an external device of the memory device 100 may be provided, and a plurality of pads for inputting/outputting the data DATA may be provided. The pads may be located adjacent to a peripheral circuit, which processes a signal transmitted to the outside of the memory device 100 or a signal received from the outside of the memory device 100, in a vertical direction (e.g., the third direction) or a horizontal direction (e.g., the first direction or the second direction).

Figure 3:
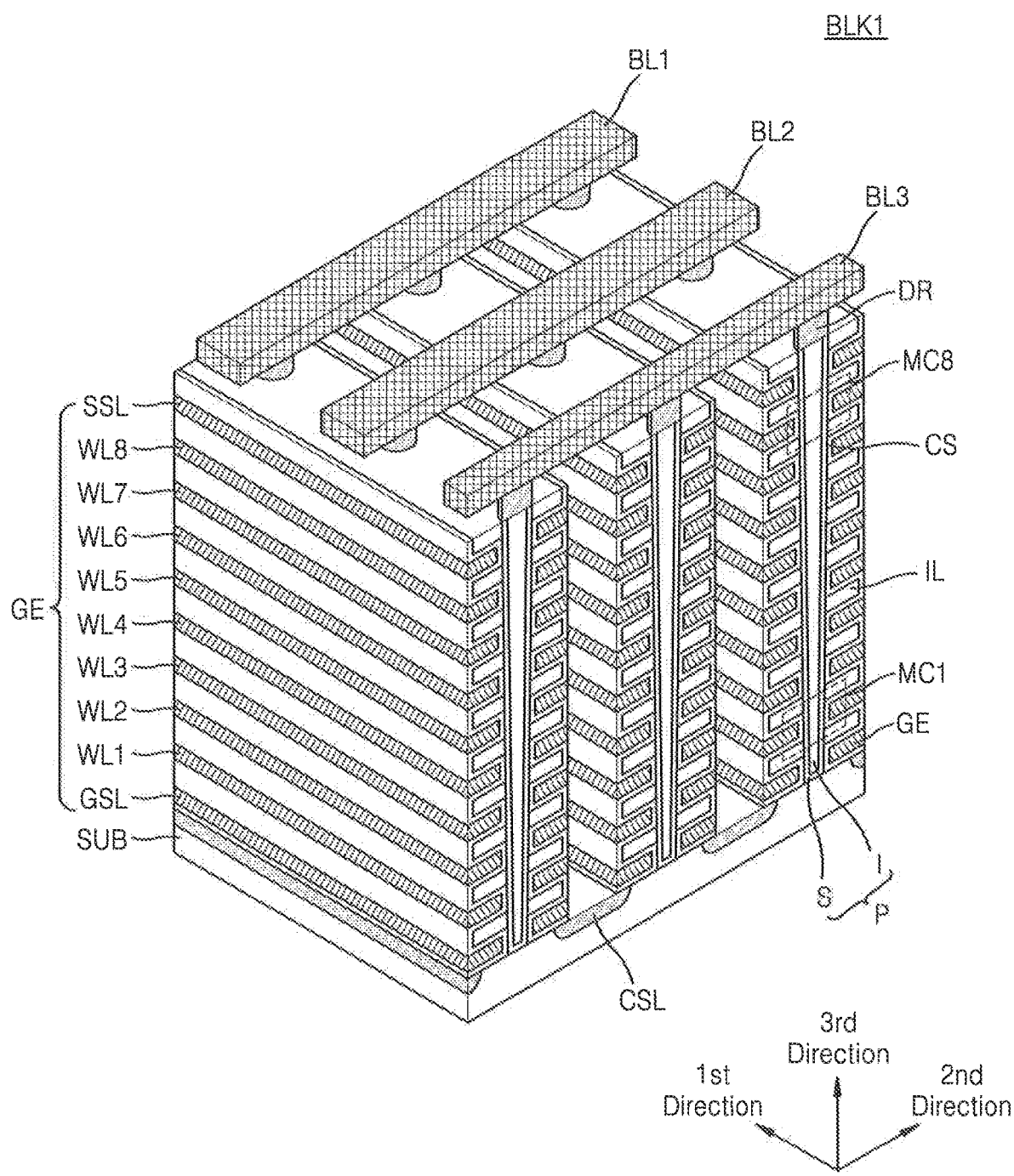
FIG. 3 is a perspective view illustrating a first memory block from among memory blocks of FIG. 1 according to an exemplary embodiment of the inventive concept.

FIG. 3 is a perspective view illustrating the first memory block BLK1 from among the memory blocks of FIG. 1 according to an exemplary embodiment of the inventive concept.

Referring to FIG. 3, the first memory block BLK1 may be formed in a vertical direction perpendicular to a substrate SUB. Although the first memory block BLK1 includes two selection lines e.g., the ground selection line GSL and the string selection line SSL), eight word lines (e.g., first through eighth word lines WL1 through WL8), and three bit lines (e.g., first through third bit lines BL1 through BL3), the first memory block BLK1 may include more or less of these elements than illustrated in FIG. 3. In addition, in an exemplary embodiment of the inventive concept, the first memory block BLK1 may include one or more dummy word lines between the first word line WL1 and the ground selection line GSL.

The substrate SUB may be a polysilicon film doped with an impurity of a first conductivity type (e.g., a p-type). The substrate SUB may be a bulk silicon substrate, a silicon-on-insulator (SOI) substrate, a germanium substrate, a germanium-on-insulator (GOI) substrate, a silicon-germanium substrate, or a substrate of an epitaxial thin film obtained by performing selective epitaxial growth (SEG). The substrate SUB may include a semiconductor material. For example, the substrate SUB may include silicon (Si), germanium (Ge), silicon germanium (SiGe), gallium arsenide (GaAs), indium gallium arsenide (InGaAs), aluminum gallium arsenide (AlGaAs), or a combination thereof.

A common source line CSL that extends in the first direction and is doped with an impurity of a second conductivity type (e.g., tri n-type) may be provided in the substrate SUB. A plurality of insulating films IL that extend in the first direction may be sequentially provided on a portion of the substrate SUB between two adjacent common source lines CSL in the third direction. The plurality of insulating films IL may be spaced apart from each other by a certain distance in the third direction. For example, each of the plurality of insulating films IL may include an insulating material such as silicon oxide.

A plurality of pillars P that are sequentially arranged in the second direction and pass through the plurality of insulating films IL in the third direction may be provided on a portion of the substrate SUB between two adjacent common source lines CSL. For example, the plurality of pillars P may pass through the plurality of insulating films IL and may contact the substrate SUB. For example, a surface layer S of each of the pillars P may include a silicon material doped with an impurity of the first conductivity type, and may function as a channel region. An inside I of each of the pillars P may include an insulating material such as silicon oxide or an air gap.

A charge storage layer CS may be provided along exposed surfaces of the insulating films IL, the pillars P, and the substrate SUB, in an area between two adjacent common source lines CSL. The charge storage layer CS may include a gate insulating layer (e.g., a 'tunneling insulating layer'), a charge trap layer, and a blocking insulating layer. For example, the charge storage layer CS may have an oxide-nitride-oxide (ONO) structure. In addition, gate electrodes GE such as the ground and string selection lines GSL and SSL and the first through eighth word lines WL1 through WL8 may be provided on an exposed surface of the charge storage layer CS, in areas between two adjacent common source lines CSL.

Drains or drain contacts DR may be respectively provided on the plurality of pillars P. For example, each of the drains or the drain contacts DR may include a silicon material doped with an impurity of the second conductivity type. The first through third bit lines BL1 through BL3 that extend in a second direction and are spaced apart by a certain distance it the first direction may be provided on the drain contacts DR.

Figure 4:
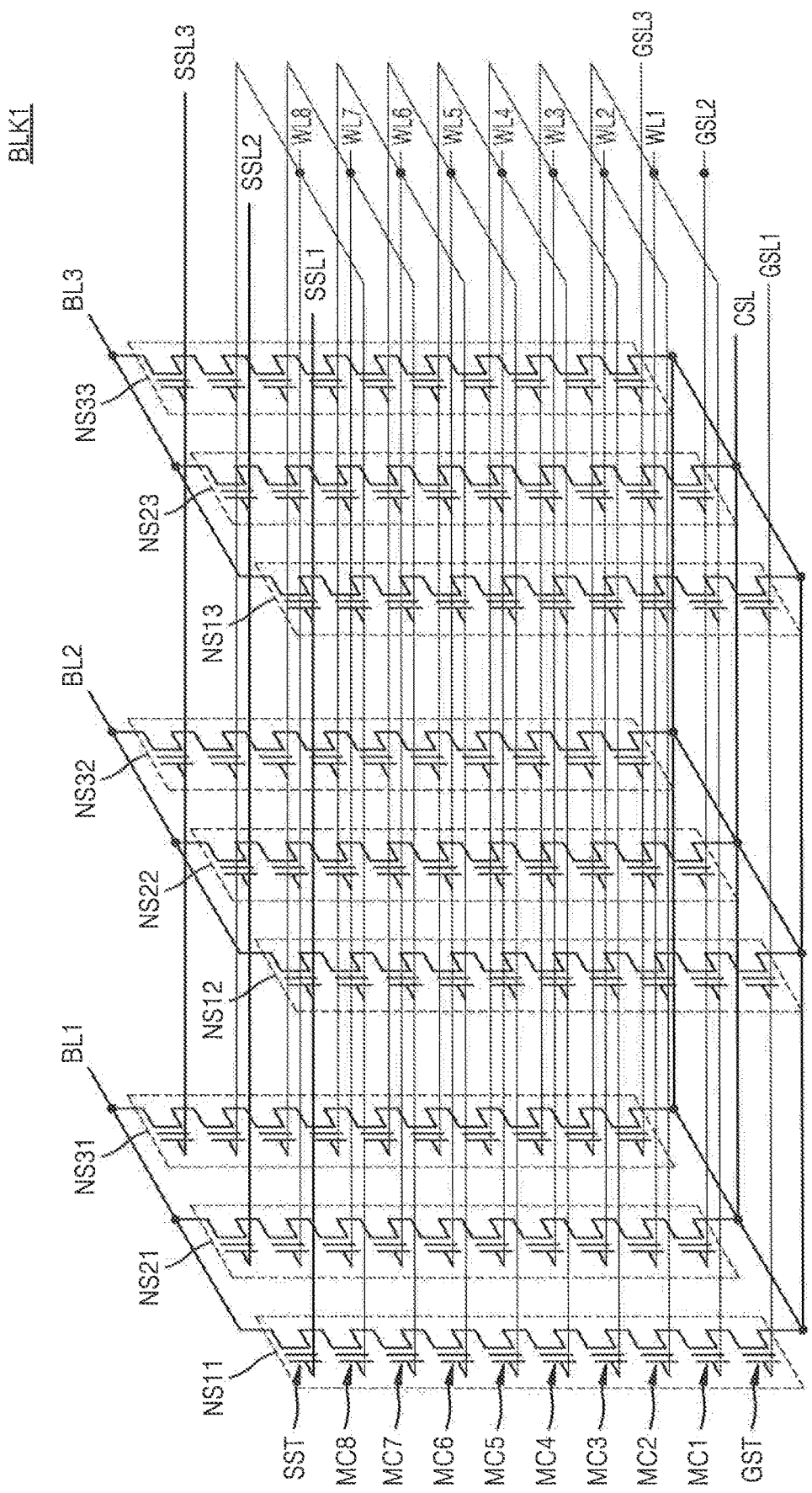
FIG. 4 is a circuit diagram illustrating an equivalent circuit of the first memory block from among the memory blocks of FIG. 1, according to an exemplary embodiment of the inventive concept.

FIG. 4 is a circuit diagram illustrating an equivalent circuit of the first memory block BLK1 from among the memory blocks of FIG. 1, according to an exemplary embodiment of the inventive concept.

Referring to FIG. 4, the first memory block BLK1 may be a vertical NAND flash memory, and each of the first through $z^{th}$ memory blocks BLK1 through BLKz of FIG. 1 may be implemented as shown in FIG. 4. The first memory block BLK1 may include a plurality of NAND strings NS11 through NS33, a plurality of word lines, e.g., the first through eighth word lines WL1 through WL8, a plurality of bit lines, e.g., the first through third bit lines BL1 through BL3, a plurality of ground selection lines, e.g., first through third ground selection lines GSL1 through GSL3, a plurality of string selection lines, e.g., first through third string selection lines SSL1 through SSL3, and the common source line CSL. The number of NAND strings, the number of word lines, the number of bit lines, the number of ground selection lines, and the number of string selection lines may be changed in various ways according to exemplary embodiments of the inventive concept.

The NAND strings NS11, NS21, and NS31 are provided between the first bit line BL1 and the common source line CSL, the NAND strings NS12, NS22, and NS32 are provided between the second bit line BL2 and the common source line CSL, and the NAND strings NS13, NS23, NS33 are provided between the third bit line BL3 and the common source line CSL. Each NAND string e.g., NS11) may include a string selection transistor SST, a plurality of memory cells MC1 through MC8, and a ground selection transistor GST.

NAND strings commonly connected to one bit line may constitute one column. For example, the NAND strings NS11, NS21, and NS31 commonly connected to the first bit line BL1 may correspond to a first column, the NAND strings NS12, NS22, and NS32 commonly connected to the second bit line BL2 may correspond to a second column, and the NAND strings NS13, NS23, and NS33 commonly connected to the third bit line BL3 may correspond to a third column.

NAND strings connected to one string selection line may constitute one row. For example, the NAND strings NS11, NS12, and NS13 connected to the first string selection line SS1 may correspond to a first row, the NAND strings NS21, NS22, and NS23 connected to the second string selection line SSL2 may correspond to a second row, and the NAND strings NS31, NS32, and NS33 connected to the third string selection line SSL3 may correspond to a third row.

The string selection transistors SST may be connected to the first through third string selection lines SSL1 through SSL3. The plurality of memory cells MC1 through MC8 may be respectively connected to the first through eighth word lines WL1 through WL8. The ground selection transistors GST may be connected to the first through third ground selection lines GSL1 through GSL3, and the string selection transistors SST may be connected to the first through third bit lines BL1 through BL3. The ground selection transistors GST may be connected to the common source line CSL.

In the present embodiment, word lines at the same height (e.g., WL1) are commonly connected, the first through third string selection lines SSL1 through SSL3 at the same height are separated from one another, and the first through third ground selection lines GSL1 through GSL3 at the same height are separated from one another. For example, when memory cells connected to the first word line WL1 and included in the NAND strings NS11, NS12, and NS13 corresponding to the first column are programmed, the first word line WL1 and the first string selection line SS1 are selected. However, the inventive concept is not limited thereto, and in other embodiments, the first through third ground selection lines GSL1 through GSL3 may be commonly connected.

Figure 5A:
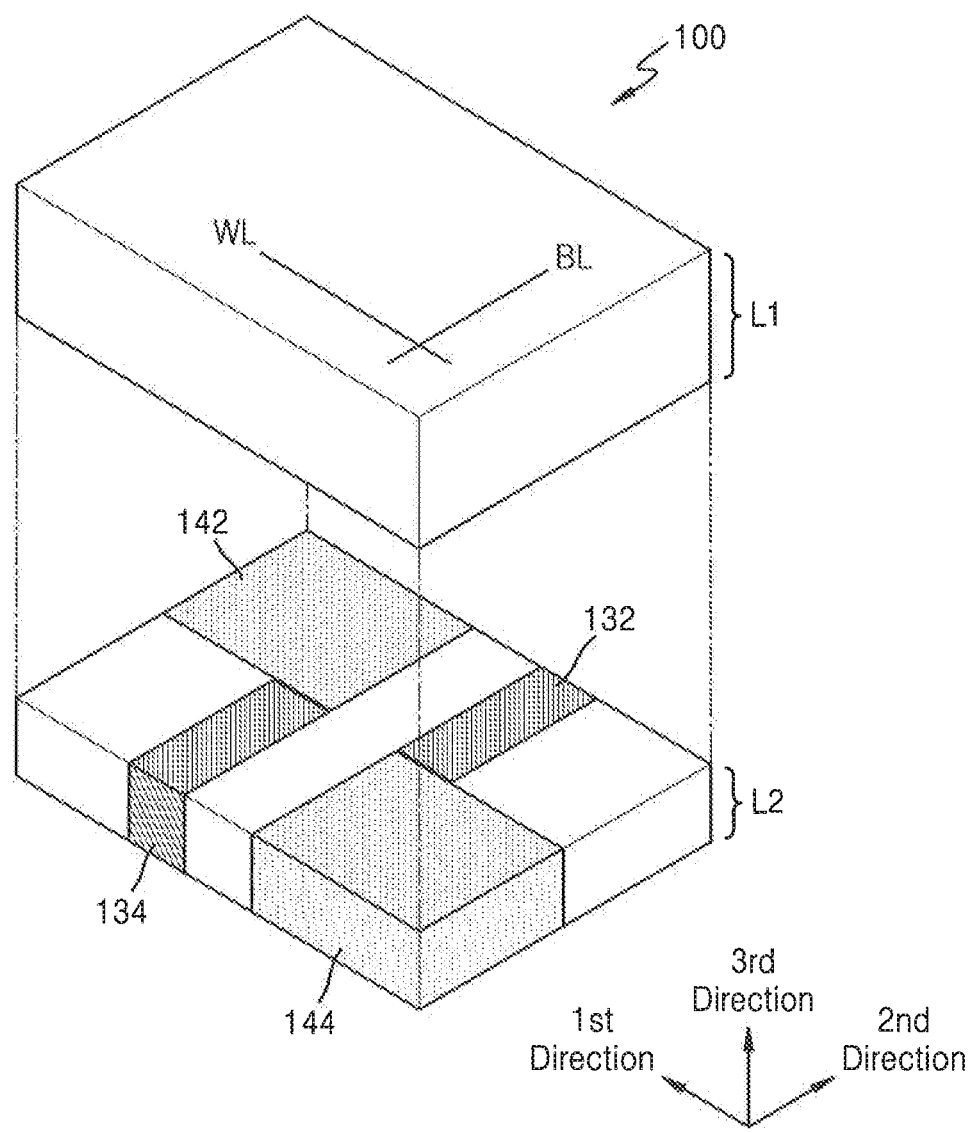
FIG. 5A is a view illustrating a structure of the memory device including first and second semiconductor layers according to an exemplary embodiment of the inventive concept.
Figure 5B:
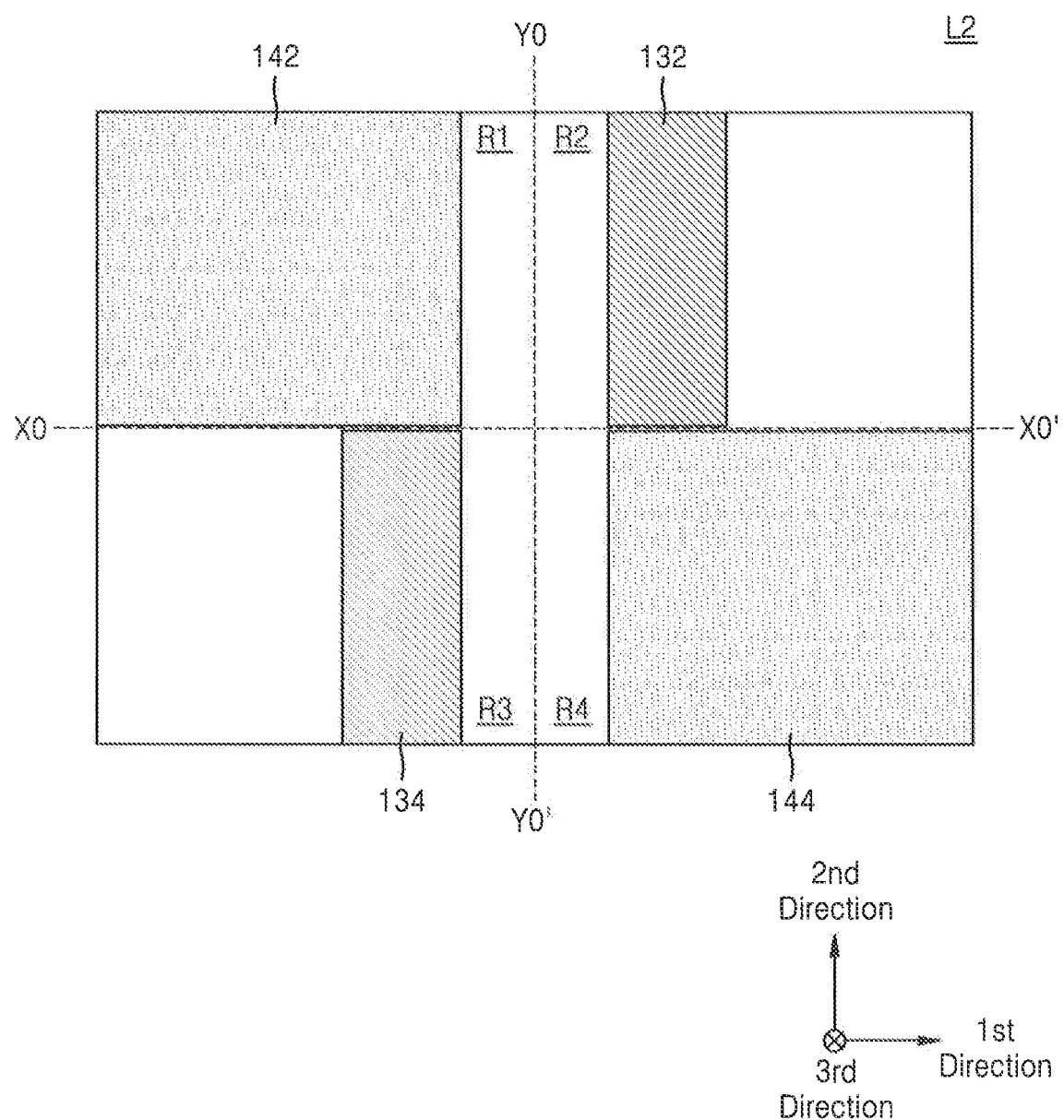
FIG. 5B is a plan view illustrating a top surface of the second semiconductor layer contacting the first semiconductor layer of the memory device, according to an exemplary embodiment of the inventive concept.
Figure 5C:
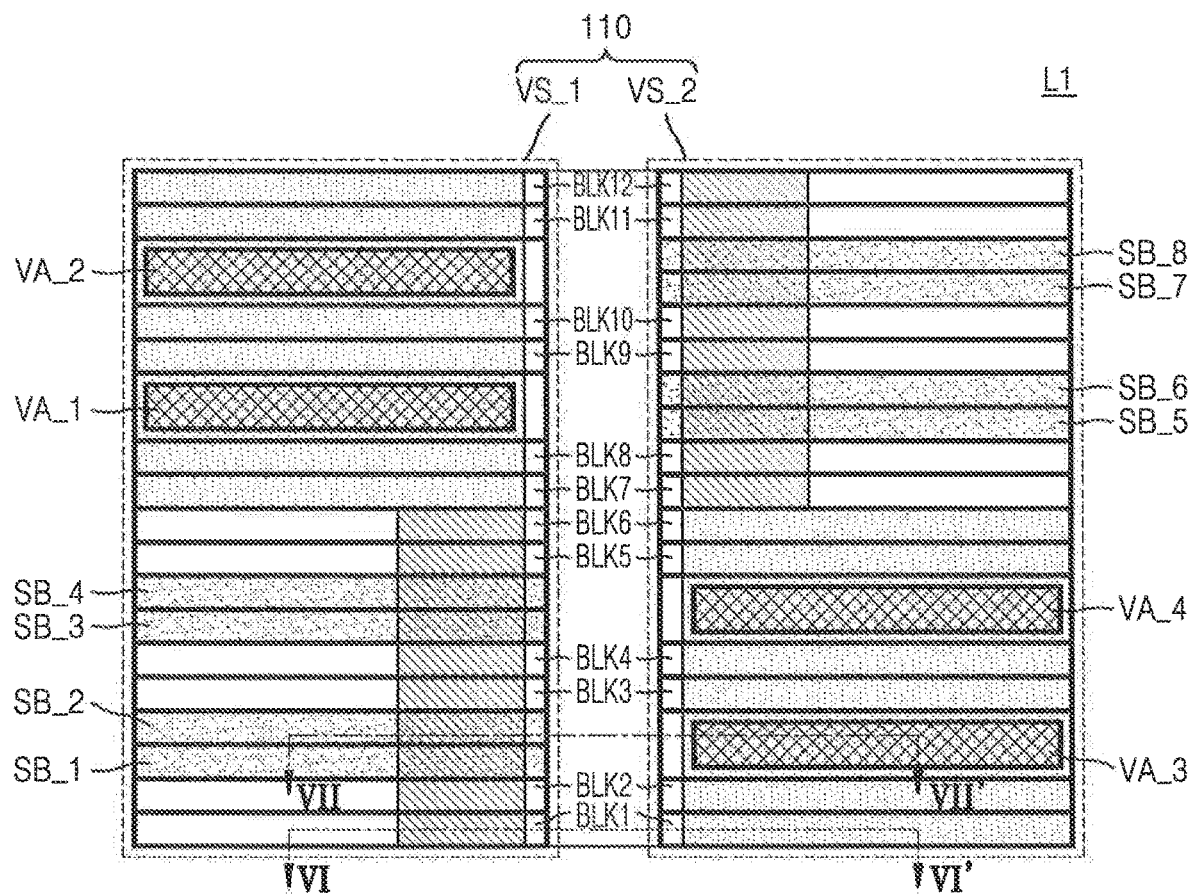
FIG. 5C is a plan view illustrating a top surface of the first semiconductor layer overlapping the plan view of FIG. 5B, according to an exemplary embodiment of the inventive concept.

FIG. 5A is a view illustrating a structure of the memory device 100 including the first and second semiconductor layers L1 and L2 according to an exemplary embodiment of the inventive concept. FIG. 5B is a plan view illustrating a top surface of the second semiconductor layer L2 contacting the first semiconductor layer L1 of the memory device 100, according to an exemplary embodiment of the inventive concept. FIG. 5C is a plan view illustrating a top surface of the first semiconductor layer L1 overlapping the plan view of FIG. 5B, according to an exemplary embodiment of the inventive concept. In FIGS. 5A to 5C, the first and second semiconductor layers L1 and L2 are spaced apart from each other in the third direction for convenience of explanation. However, a bottom surface of the first semiconductor layer L1 and the top surface of the second semiconductor layer L2 actually contact each other as shown in FIG. 2.

Referring to FIGS. 5A through 5C, the first and second row decoders 132 and 134 may extend in a direction e.g., the second direction in which the word lines WL are arranged) perpendicular to a direction which the word lines WL extend. In addition, the first and second page buffers 142 and 144 may extend in a direction (e.g., the first direction in which the bit lines BL are arranged) perpendicular to the bit lines BL. In other words, in the memory device 100 having a COP structure, the row decoder 130 (see FIG. 1) and the page buffer 140 (see FIG. 1) may be divided into two or more parts and may be arranged as shown in FIGS. 5A and 5B to increase the area of the row decoder 130 and the page buffer 140 overlapping the memory cell array 110 (see FIG. 1) of the first semiconductor layer L1 in the third direction.

Referring to FIG. 5B, the second semiconductor layer L2 may be divided into first through fourth regions R1 through R4 by a first virtual line X0-X0' in the first direction parallel to the word lines WL and a second virtual line Y0-Y0' in the second direction parallel to the bit lines BL. For example, the first virtual line X0-X0' and the second virtual line Y0-Y0' may overlap the memory cell array 110 (see FIG. 1) located on the first semiconductor layer L1 in the third direction. In other words, at least a part of each of the first through fourth regions R1 through R4 may overlap the memory cell array 110 located on the first semiconductor layer L1 in the third direction.

The first and second row decoders 132 and 134 may be respectively located in the second and third regions R2 and R3, and the first and second page buffers 142 and 144 may be respectively located in the first and fourth regions R1 and R4. Although the first through fourth regions R1 through R4 have the same area in the present embodiment, the inventive concept is not limited thereto.

Referring to FIG. 5C, the memory cell array 110 may be located on the first semiconductor layer L1, and the memory cell array 110 may include a first vertical structure. VS_1 and a second vertical structure VS_2. As shown in FIG. 5C, the memory cell array 110 may include a plurality of memory blocks, e.g., first through twelfth memory blocks BLK1 through BLK12 formed as the first and second vertical structures VS_1 and VS_2. The first through twelfth memory blocks BLK1 through BLK12 may be arranged in the second direction. Although the number of memory blocks is 12 in the present embodiment, the inventive concept is not limited thereto.

As shown in FIG. 5C, the first vertical structure VS_1 may include a plurality of first partial blocks SB_1 through SB_4 and a plurality of first via areas VA_1 through VA_2. In addition, the second vertical structure VS_2 may include a plurality of second partial blocks SB_5 through SB_8 and a plurality of second via areas VA_3 and VA_4. The inventive concept is not limited to the number of first and second partial blocks and the number of first and second via areas illustrated in the present embodiment.

For example, in the first via areas VA_1 and VA_2, one or more first through-hole vias that each pass through the first vertical structure VS_1 and are connected to the first page buffer 142 may be formed. In addition, in the second via areas VA_3 and VA_4, one or more second through-hole vias that each pass through the second vertical structure VS_2 and are connected to the second page buffer 144 may be formed.

In an exemplary embodiment of the inventive concept, at least one of the first partial blocks SB_1 through. SB_4 may be electrically connected to the second row decoder 134. In addition, at least one of the second partial blocks SB_5 through SB_8 may be electrically connected to the first row decoder 132.

In an exemplary embodiment of the inventive concept, at least parts of the first partial blocks SB_1 and SB_2 may overlap the second via area VA_3 in the first direction. When at least parts of the first partial blocks SB_1 and SB_2 overlap the second via area VA_3, the second via area VA_3 may overlap at least parts of the first partial blocks SB_1 and SB_2. In addition, at least parts of the first partial blocks SB_3 and SB_4 may overlap the second via area VA_4 in the first direction.

In an exemplary embodiment of the inventive concept, at least parts of the second partial blocks SB_5 and SB_6 may overlap the first via area VA_1 in the first direction. In addition, at least parts of the second partial blocks SB_7 and SB_8 may overlap the first via area VA_2 in the first direction.

Figure 6:
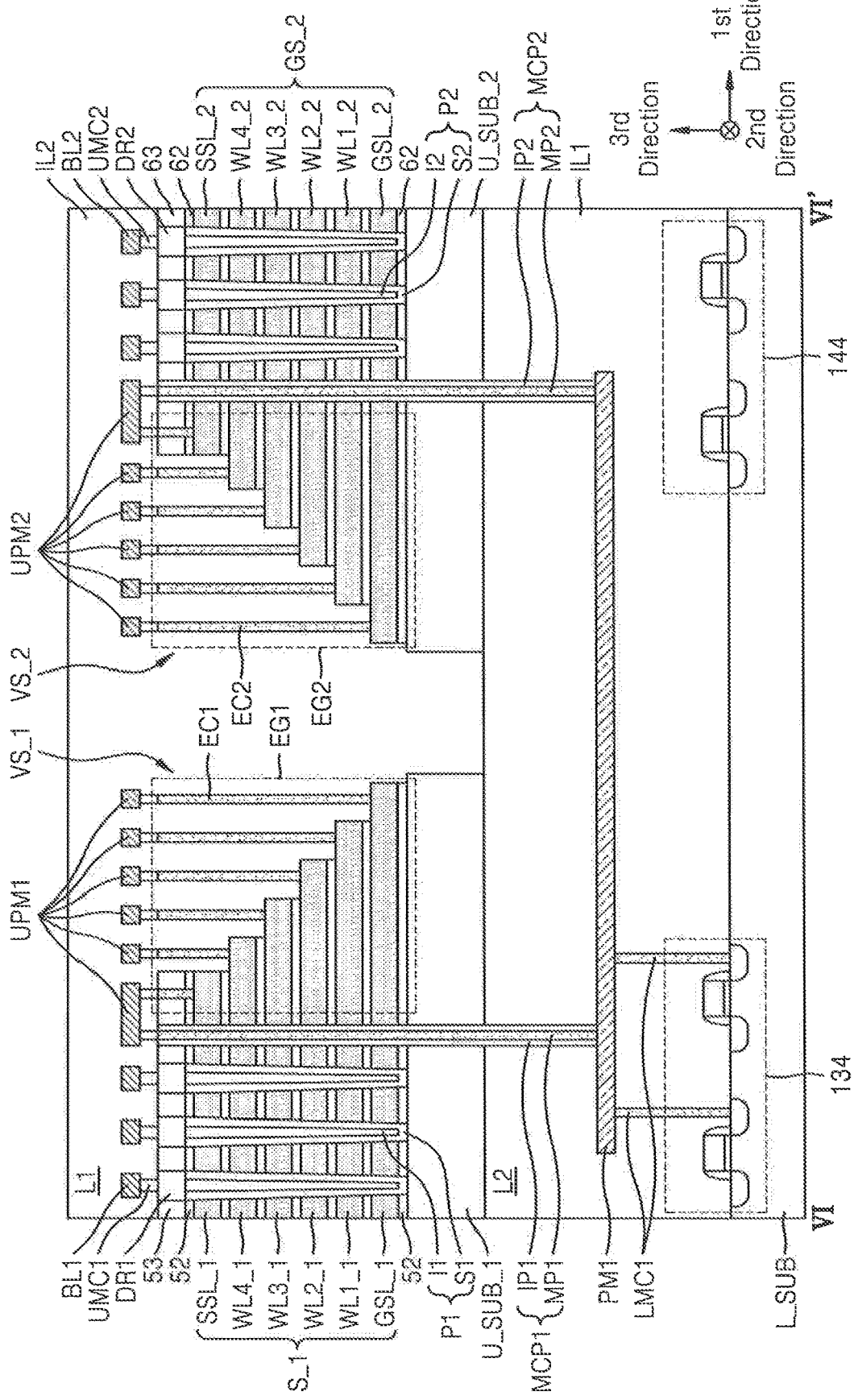
FIG. 6 is a cross-sectional view of the memory device according to an exemplary embodiment of the inventive concept.

FIG. 6 is a cross-sectional view of the memory device 100 according to an exemplary embodiment of the inventive concept. For example, FIG. 6 is a cross-sectional view taken along line VI-VI' of FIG. 5C, illustrating configurations of the first and second semiconductor layers L1 and L2. For example, FIG. 6 is a cross-sectional view of the first memory block BLK1 provided on the first semiconductor layer L1 and the second semiconductor layer L2 overlapping the first memory block BLK1.

Referring to FIG. 6, the second semiconductor layer L2 may include a lower substrate L_SUB, and the second row decoder 134 and the second page buffer 144 formed on the lower substrate L_SUB. In addition, the second semiconductor layer L2 may include a plurality of first lower contacts LMC1 electrically connected to the second row decoder 134, a first lower conductive line PM1 electrically connected to the plurality of first lower contacts LMC1, and a lower insulating layer IL1 covering the plurality of first lower contacts LMC1 and the first lower conductive line PM1. For example, the lower substrate L_SUB may be a semiconductor substrate including a semiconductor material such as single-crystal silicon or single-crystal germanium, and may be manufactured from a silicon wafer.

The second row decoder 134 and the second page buffer 144 may be formed on portions of the lower substrate L_SUB. In other words the second row decoder 134 and/or the second page buffer 144 may be formed by forming a plurality of transistors on the lower substrate L_SUB.

The first semiconductor layer L1 may include a first upper substrate U_SUB_1, a second upper substrate U_SUB_2, the first vertical structure VS_1 located on the first upper substrate U_SUB_1, and the second vertical structure VS_2 located on the second upper substrate U_SUB_2. In addition, the first semiconductor layer L1 may include plurality of first upper contacts UMC1, a plurality of first bit lines BL1, a plurality of first edge contacts EC1, and a plurality of first upper conductive line UPM1 which are electrically connected to the first vertical structure VS_1. In addition, the first semiconductor layer L1 may include a plurality of second upper contacts UMC2, a plurality of second bit lines BL2, a plurality of second edge contacts EC2, and a plurality of second upper conductive lines UPM2 which are electrically connected to the second vertical structure VS_2. In addition, the first semiconductor layer L1 may include an upper insulating layer IL2 covering the first and second vertical structures VS_1 and VS_2 and various conductive lines.

The first and second upper substrates U_SUB_1 and U_SUB_2 mays be support layers that respectively support first and second gate conductive layers GS_1 and GS_2. The first and second upper substrates U_SUB_1 and U_SUB_2 may be, for example, base substrates.

Each of the first and second upper substrates U_SUB_1 and U_SUB_2 may be a polysilicon film doped with an impurity of a first conductivity type (e.g., a p-type) Each of the first and second upper substrates U_SUB_1 and U_SUB_2 may be a bulk silicon substrate an SOI substrate, a germanium substrate, a GOI substrate, a silicon-geranium substrate, or a substrate of an epitaxial thin film obtained by performing SEG. Each of the first and second upper substrates U_SUB_1 and U_SUB_2 include a semiconductor material. For example, each of the first and second upper substrates U_SUB_1 and U_SUB_2 may include Si, Ge, SiGe, GaAs, InGaAs, AlGaAs, or a combination thereof.

The first vertical structure VS_1 may include the first gate conductive layers GS_1 located on the first upper substrate U_SUB_1, and a plurality of pillars P1 that pass through the first gate conductive layers GS_1 and extend in the third direction on a top surface of the first upper substrate U_SUB_1. The first gate conductive layers GS_1 may include a ground selection line GSL_1, word lines WL1_1 through WL4_1, and a string selection line SSL_1. The ground selection line GSL_1, the word lines WL1_1 through WL4_1, and the string selection line SSL_1 may be sequentially formed on the first upper substrate U_SUB_1, and an insulating layer 52 may be located under or over each of the first gate conductive layers GS_1. Since the first and second vertical structures VS_1 and VS_2 have corresponding configurations in the cross-sectional view taken along line VI-VI' of the first memory block BLK1 of FIG. 6, a repeated explanation of elements of the second vertical structure VS_2 corresponding to those of the first vertical structure VS_1 may not be given.

The second vertical structure VS_2 may include a plurality of pillars P2 that pass through the second gate conductive lavers GS_2. Each of the pillars P2 may include a surface layer S2 and an inside I1. The second gate conductive layers GS_2 may include a ground selection line GSL_2, word lines WL1_2 through WL4_2, and a string selection line SSL_2. An insulating layer 62 may be located under or over each of the second gate conductive layers GS_2.

In addition, although four word lines are formed in the first vertical structure VS_1 in the present embodiment, the inventive concept is not limited thereto. For example, a various number of word lines may be stacked between the ground selection line GSL_1 and the string selection line SSL_1 in a vertical direction (e.g., the third direction) perpendicular to the first upper substrate U_SUB_1 and the insulating layer 52 may be located between adjacent word lines. In addition, two or more ground selection lines GSL_1 and two or more string selection lines SSL_1 may be stacked in the vertical direction.

Each of the plurality of pillars P1 may include a surface layer S1 and an inside I1. For example, the surface layer S1 of each of the pillars P1 may include a silicon material doped with an impurity, or a silicon material not doped with an impurity. The surface layer S1 may function as, for example, a channel region. The surface layer S1 may be formed to have a cup shape (or a cylindrical shape with a closed bottom) that extends in the third direction. The inside I1 of each of the pillars P1 may include an insulating material such as silicon oxide or an air gap.

For example, the ground selection line GSL_1 and a portion of the surface layer S1 adjacent to the ground selection line GSL_1 may constitute the wound selection transistor. GST (see FIG. 4). In addition, the word lines WL1_1 through WL4_1 and a portion of the surface layer S1 adjacent to the word lines WL1_1 through WL4_1 may constitute the memory cell transistors MC1 through MC8 (see FIG. 4). In addition, the string selection line SSL_1 and a portion of the surface layer S1 adjacent to the string selection line SSL_1 may constitute the string selection transistor SST (see FIG. 4).

A drain region DR1 may be formed on the pillar P1. A drain region DR2 may be formed on the pillar P2. For example, the drain region DR1 may include a silicon material doped with an impurity. The drain region DR1 may be a channel pad. For example, the drain region DR1 may be electrically connected to the first bit line BL1 through the first upper contact UMC1.

An etch-stop film 53 may be formed on a side wall of the drain region DR1. An etch-stop film 63 may be formed on a side wall of the drain region DR2. A top surface of the etch-stop film 53 may be formed at the same level as a top surface of the drain region DR1. The etch-stop film 53 may include an insulating material such as silicon nitride or silicon oxide.

The first vertical structure VS_1 may include an edge region EG1. The second vertical structure VS_2 may include an edge region EG2. As shown in FIG. 6, a cross-section of the edge region EG1 may form a stepped pad structure. The stepped pad structure may be referred to as a "word line pad". The plurality of first edge contacts EC1 may be connected to the edge region EG1, and an electrical signal may be applied from a peripheral circuit such as the second row decoder 134 through the first edge contacts EC1. For example, a contact plug MCP1 that passes through the first vertical structure VS_1, the first upper substrate U_SUB_1, and a part of the second semiconductor layer L2 may have one side connected to the first lower conductive line PM1 and the other side electrically connected to the edge region EG1 through the first upper conductive lines UPM1. At least some of the first edge contacts EC1 may pass through parts of the first and second semiconductor layers L1 and L2 in the third direction between the first and second upper substrates U_SUB_1 and U_SUB_2 and may have one side electrically connected to a contact plug connected to the lower conductive line (e.g., PM1). The contact plug MCP1 may include an insulating film pattern IP1 and a conductive pattern MP1.

A contact plug MCP2 that passes through the second vertical structure VS_2, the second upper substrate U_SUB_2, and a part of the second semiconductor layer L2 may have one side connected to the first lower conductive line PM1 and the other side electrically connected to the edge region EG2 through the second upper conductive lines UPM2. The contact plug MCP2 may include an insulating film pattern IP2 and a conductive pattern MP2.

Figure 7:
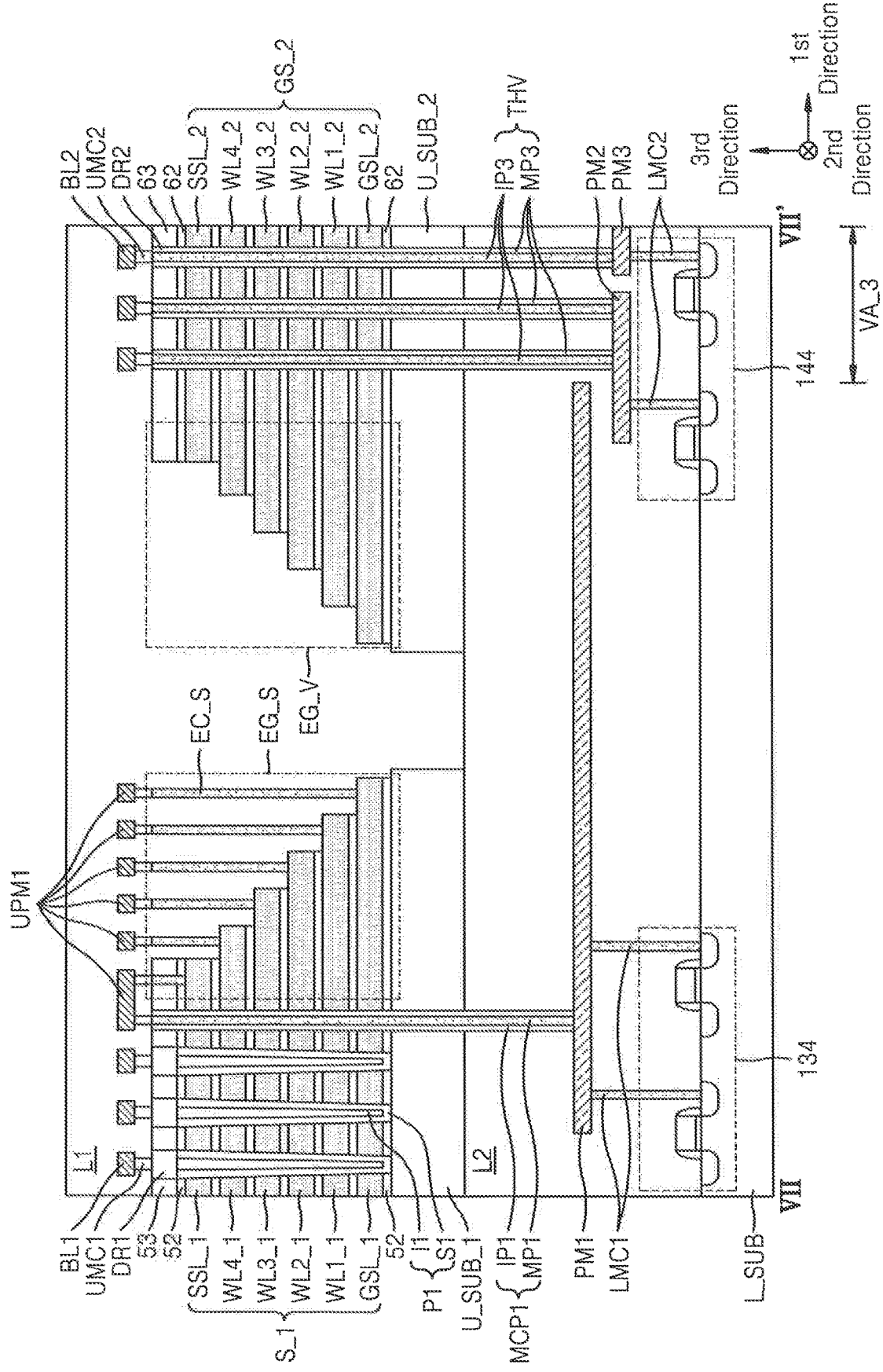
FIG. 7 is a cross-sectional view of the memory device according to an exemplary embodiment of the inventive concept.

FIG. 7 is a cross-sectional view of the memory device 100 according to an exemplary embodiment of the inventive concept. For example, FIG. 7 is a cross-sectional view taken along line VII-VII' of FIG. 5C, illustrating configurations of the first and second semiconductor layers L1 and L2. For example, FIG. 7 may be a cross-sectional view illustrating the first partial block SB_1 and the second via area VA_3 provided on the first semiconductor layer L1 and the second semiconductor layer L2 overlapping the first partial block SB_1 and the second via area VA_3. A repeated explanation of the same elements in FIG. 6 may not be given in FIG. 7.

Referring to FIG. 7, a plurality of through-hole vias THV passing through the second vertical structure VS_2, the second upper substrate and a part of the second semiconductor layer L2 may be formed in the second via region VA_3. Each of the through-hole vias THV mays include an insulating film pattern IP3 and a conductive pattern MP3. As shown in FIG. 7, each of the through-hole vias THV may electrically connect the second page buffer 144 and the second upper contact UMC2. The second upper contact UMC2 may be connected to the second bit line BL2. In other words, the second bit lines BL2 may be electrically connected to the second page buffer 144 formed on the second semiconductor layer L2 through the plurality of through-hole vias THV formed in the second via area VA_3.

The plurality of through-hole vias THV may be connected to the second page buffer 144 via second and third lower conductive lines PM2 and PM3, for example. The second and third lower conductive lines PM2 and PM3 may be connected to the second page buffer 144 via second lower contacts LMC2, for example.

In an exemplary embodiment of the inventive concept, conductive patterns such as contacts may not be formed in the edge region EG_V of the second via area VA_3. In an exemplary embodiment of the inventive concept, additional dummy conductive patterns may be formed in the edge region EG_V.

The first partial block SB_1 may overlap at least a part of the first via area VA_3 in the first direction. In an exemplary embodiment of the inventive concept, the first partial block SB_1 may include the plurality of pillars P1 that pass through the first gate conductive layers GS_1 and extend in the third direction on a top surface of the first upper substrate U_SUB_1. In addition, a plurality of edge contacts EC_S may be connected to an edge region EG_S of the first partial block SB_1. An electrical signal may be applied from a peripheral circuit such as the second row decoder 134 through the plurality of edge contacts EC_S. For example, the first partial block SB_1 may include a plurality of strings including a plurality of memory cells and may function as a partial memory block.

Since the memory device 100 according to an exemplary embodiment of the inventive concept includes partial blocks overlapping a via area where through-hole vias are formed in the first direction, a degree of integration may be increased. In addition, since the partial blocks may function as spare blocks, the number of additional spare blocks may be reduced. Accordingly, a chip size of the memory device 100 may be reduced.

Figure 8A:
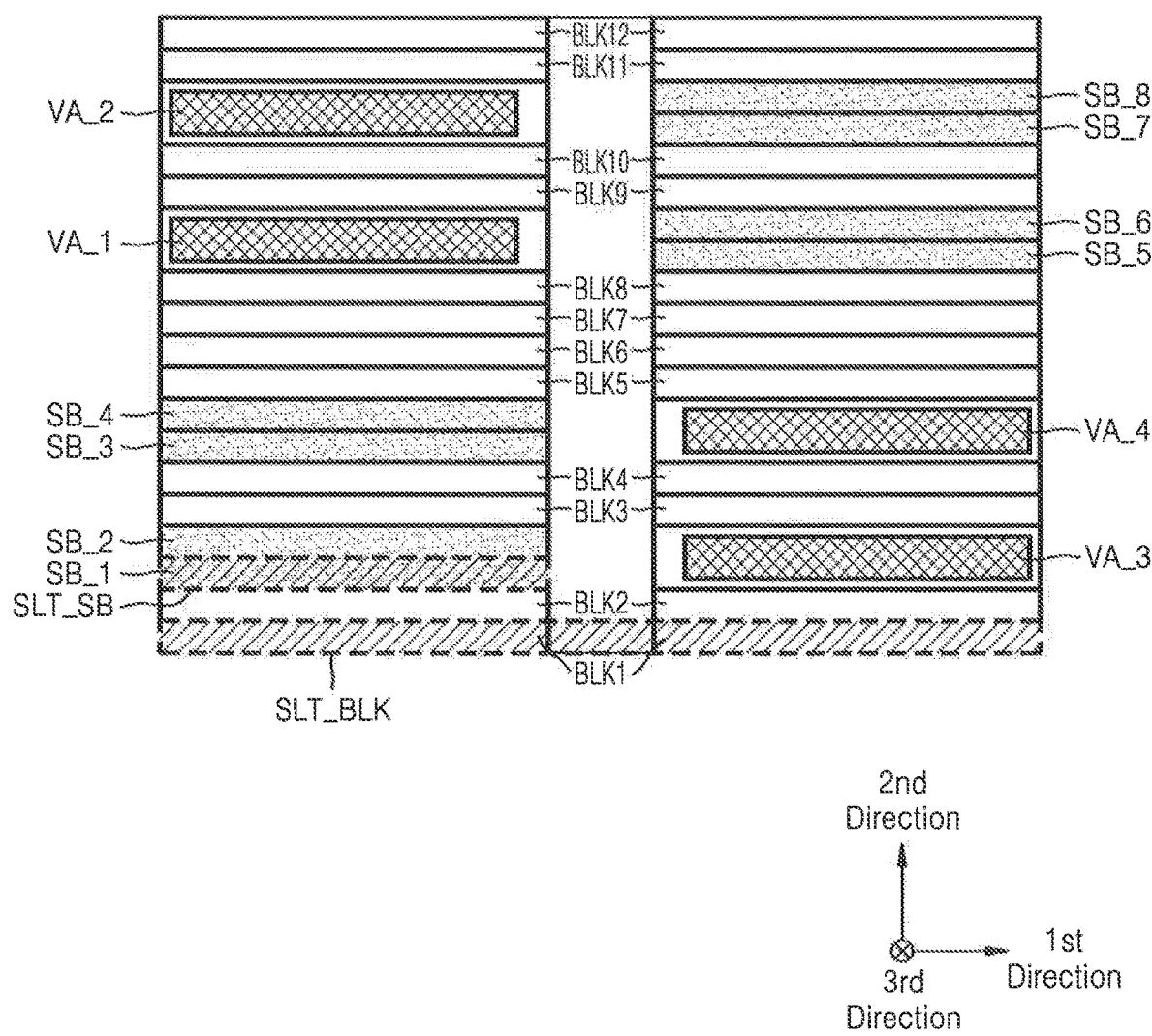
FIGS. 8A and 8B are views for explaining an operation of a memory device including a partial block according to an exemplary embodiment of the inventive concept.
Figure 8B:
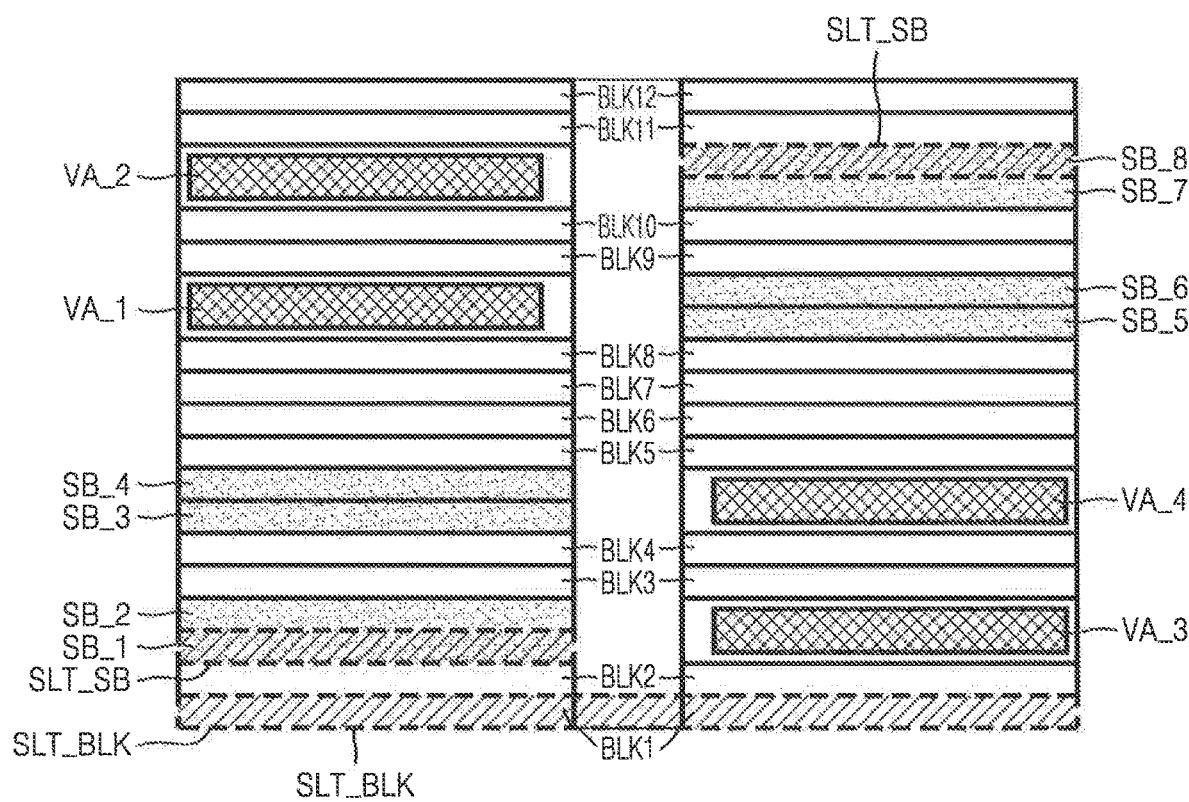
Figure 8B:
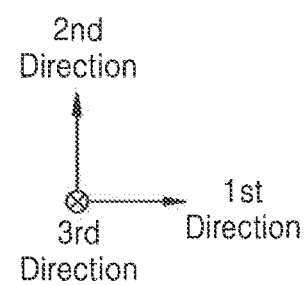

FIGS. 8A and 8B are views for explaining an operation of a memory device including a partial block according to an exemplary embodiment of the inventive concept.

Referring to FIG. 8A, the first memory block BLK1 from among the first through twelfth memory blocks BLK1 through BLK12 may be accessed as a selected memory block SLT_BLK. The selected memory block SLT_BLK may be accessed, for example, by the row decoder 130 (see FIG. 1) and the page buffer 140 (see FIG. 1). For example, in a normal operation, the memory device 100 (see FIG. 1) may perform an access operation in units of memory blocks.

In an exemplary embodiment of the inventive concept, each of the partial blocks SB_1 through SB_8 may be independently accessed. For example, the partial blocks SB_1 through SB_1 may be accessed by the row decoder 130 (see FIG. 1) and the page buffer 140 (see FIG. 1) under the control of the control logic circuit 120 (see FIG. 1). For example, the first partial block SB_1 may be accessed as a selected partial block SLT_SB. In an exemplary embodiment of the inventive concept, any of the partial blocks SB_1 through SB_8 may be independently accessed as selected partial blocks SLT_SB, and various memory operations such as a program operation, an erase operation, and a read operation mays be performed.

Referring to FIG. 8B, two partial blocks SB_1 and SB_8 from among the partial blocks SB_1 through SB_8 may be simultaneously accessed as the selected partial blocks SLT_SB. For example, the row decoder 130 (see FIG. 1) and the page buffer 140 (see FIG. 1) may simultaneously access one of the first partial blocks SB_1 through SB_4 and one of the second partial blocks SB_5 through SB_8 under the control of the control logic circuit 120 (see FIG. 1). For example, the partial blocks SB_1 and SB_8 simultaneously accessed as the selected partial blocks SLT_B may be accessed as memory blocks having the same memory size as that of the selected memory block SLT_BLK. In this case, various memory operations such as a program operation, an erase operation, and a read operation may be performed on the selected partial blocks SLT_SB. In an exemplary embodiment of the inventive concept, the partial blocks SB_1 through SB_8 may function as spare blocks for the first through twelfth memory block's BLK1 through BLK12.

Figures 9, 10A:
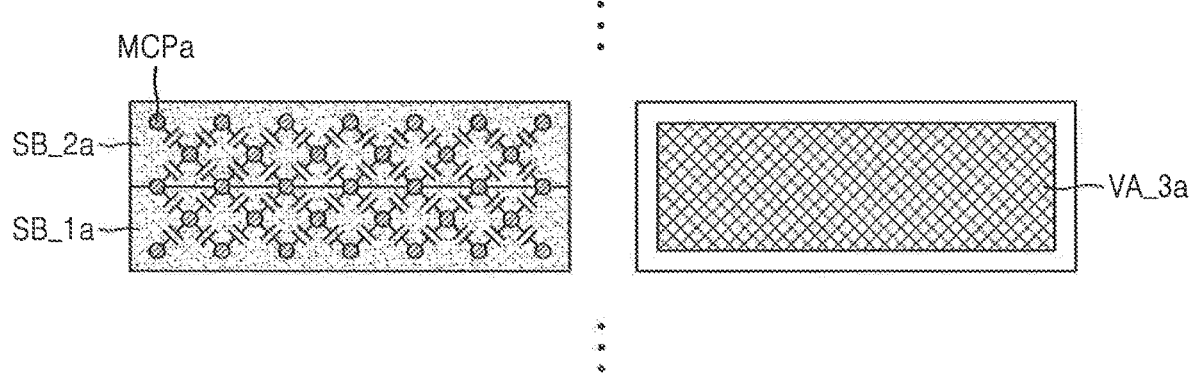
FIG. 9 is a table for explaining a use of a partial block according to an exemplary embodiment of the inventive concept.
FIG. 10A is a view illustrating a partial block according to an exemplary embodiment of the inventive concept.

FIG. 9 is a table for explaining a use of a partial block according to an exemplary embodiment of the inventive concept. For example, the table of FIG. 9 shows a type of data stored in the partial blocks SB_1 through SB_8 (see FIG. 8A) and the number of the partial blocks SB_1 through SB_8 in which each data is stored when the partial blocks SB_1 through SB_8 function as spare blocks. In the table, L, M, N, P, and Q which are natural numbers equal to or greater than 1, may be the same or different from one another.

Referring to FIG. 9, when the partial blocks SB_1 through SB_8 (see FIG. 8A) function as spare blocks for the first through twelfth memory blocks BLK1 through BLK12 (see FIG. 8A), at least one from among firmware (F/W) data, debug data, security data, meta data, and garbage collection (GC) data may be stored in each of the partial blocks SB_1 through SB_8 (see FIG. 8A). However, the inventive concept is not limited thereto, and various other pieces of data may be stored in the partial blocks SB1 through SB_8 (see FIG. 8A).

The data stored in the partial blocks SB_1 through SB_8 (see FIG. 8A) may be relatively small. For example, the data stored in the partial blocks SB_1 through SB_8 (see FIG. 8A) may be data stored according to the number of blocks. For example, the F/W data may be stored in L memory blocks, and the debug data may be stored in M memory blocks. The security data may be stored in N memory blocks, the meta data may be stored in P memory blocks, and the GC data may be stored in Q memory blocks.

In an exemplary embodiment of the inventive concept, when the partial blocks SB_1 through SB_8 (see FIG. 8A) function as spare blocks, since the data is stored in the partial blocks SB_1 through SB_8 (see FIG. 8A), the number of additional spare blocks may be reduced. Accordingly, a memory chip size may be reduced.

Figure 10B:
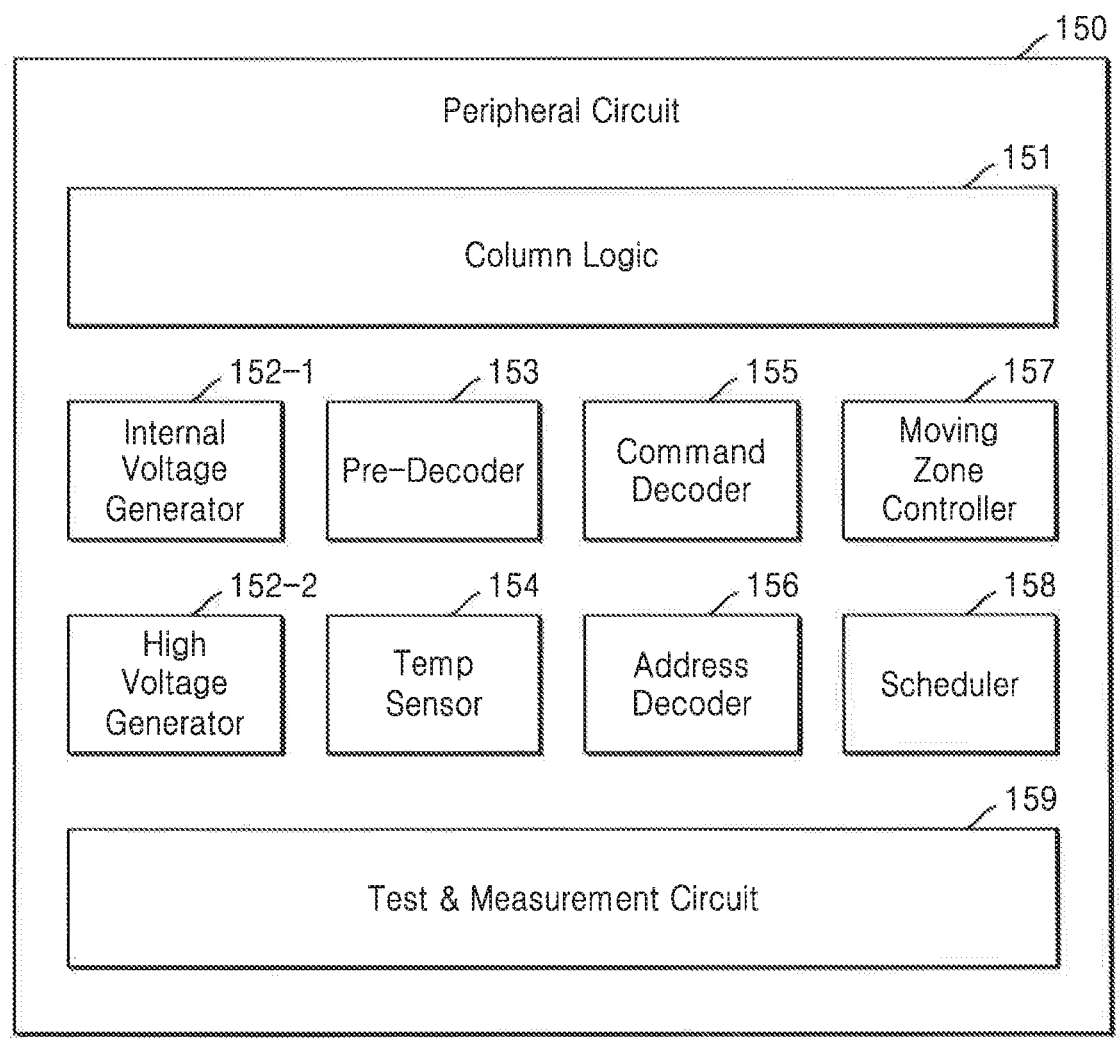
FIG. 10B is a block diagram illustrating various peripheral circuits electrically connected to the partial block of FIG. 10A according to an exemplary embodiment of the inventive concept.

FIG. 10A is a view illustrating a partial block according to an exemplary embodiment of the inventive concept. FIG. 10B is a block diagram illustrating various peripheral circuits electrically connected to the partial block of FIG. 10A according to an exemplary embodiment of the inventive concept.

Referring to FIG. 10A, a plurality of contacts MCPa may be formed in partial blocks SB_1a and SB_2a. For example, the partial blocks SB_1a and SB_2a may include gate conductive layers (e.g., GS1_1 of FIG. 7), and the plurality of contacts MCPa may pass through the gate conductive layers and may be spaced apart from one another.

In an exemplary embodiment of the inventive concept, at least some of the plurality of contacts MCPa may be connected to at least one of a plurality of peripheral circuits included in the memory device 100 (see FIG. 1) and may function as a capacitor. For example, the contact MCPa may constitute an upper electrode or a lower electrode of a capacitor.

Referring to FIG. 10B, a peripheral circuit 150 uses at least some of the contacts MCPa of FIG. 10A as a capacitor. As shown in FIG. 10B, the peripheral circuit 150 may include a column logic 151, an internal voltage generator 152_1 a high voltage generator 152_2, a pre-decoder 153, a temperature sensor 154, a command decoder 155, an address decoder 156, a moving zone controller 157, a scheduler 158, and a test/measurement circuit 159. Elements of the peripheral circuit 150 of FIG. 10B are exemplary, and the peripheral circuit 150 according to an exemplary embodiment of the inventive concept may include elements not illustrated in FIG. 10B and may include elements different from those illustrated in FIG. 10B. FIG. 10B will be described with reference to FIG. 1.

The column logic 151 may generate a signal for driving the page buffer 140. The pre-decoder 153 may generate a signal to determine a timing of a signal for driving the row decoder 130. The internal voltage generator 152_1 may generate voltages used in the memory device 100, for example, voltages applied to word lines and bit lines, reference voltages, and power supply voltages. The high voltage generator 152_2 may include a charge pump and a regulator, and may generate high voltages used to program or erase memory cells of the memory cell array 110. The temperature sensor 154 may sense a temperature of the memory device 100 and may output a signal corresponding to the sensed temperature.

The command decoder 155 may latch and decode a command CMD received from the outside of the memory device 100, and may set an operation mode of the memory device 100 according to the decoded command CMD. The address decoder 156 may latch and decode an address signal ADDR received from the outside of the memory device 100, and may activate a memory block selected according to the decoded address ADDR. The moving zone controller 157 may control an operation of applying various voltages to strings, e.g., NAND strings, included in the memory cell array 110. The scheduler 158 may include a processor or a state machine, and may generate a plurality of control signals at appropriate times according to the operation mode set by the command CMD.

The test measurement circuit 159 may test or measure characteristics of the memory device 100 to provide information about the characteristics of the memory device 100 in a process of manufacturing the memory device 100. In addition, the test/measurement circuit 159 may operate according to the command CMD received from the outside of the memory device 100. Furthermore, a system including the memory device 100 may use the test/measurement circuit 159 to obtain information about the characteristics of the memory device 100 at the beginning of an operation.

In an exemplary embodiment of the inventive concept, circuits corresponding to elements of the peripheral circuit 150 of FIG. 10B may be located on the second semiconductor layer L2 of FIG. 2 or FIG. 5A along with the row decoder 130 and the page buffer 140 of FIG. 1.

Figure 11:
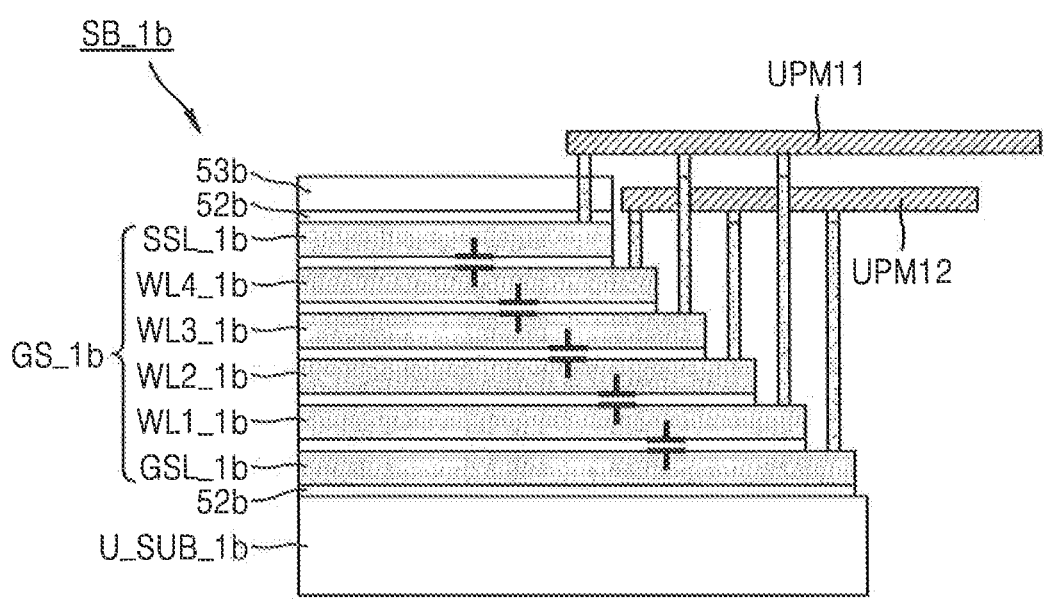
FIG. 11 is a cross-sectional view illustrating a partial block according to an exemplary embodiment of the inventive concept.

FIG. 11 is a cross-sectional view illustrating a partial block according to an exemplary embodiment of the inventive concept.

A configuration of a first partial block SB_1b of FIG. 11 is similar to a configuration of the first partial block SB_1 described with reference to FIGS. 5C and 7. However, in the present embodiment, pillars (e.g., P1 of FIG. 7) that pass through gate conductive layers GS_1b may not be formed in the first partial block SB_1b, and the gate conductive layers GS_1b and insulating layers 52b may function as a capacitor. For example, the gate conductive layers GS_1b may constitute both electrodes of the capacitor, and the insulating layer 52b may constitute a dielectric layer of the capacitor. In an exemplary embodiment of the inventive concept, the first partial block SB_1b may be connected to a peripheral circuit (e.g., 150 of FIG. 10B) through upper conductive lines UPM11 and UPM12 and a plurality of contacts that electrically connect the upper conductive lines UPM11 and UPM12 to the first partial block SB_1b.

The gate conductive layers GS_1b may include a ground selection line GSL_1b, word lines WL1_1b through WL4_1b, and a string selection line SSL_1b on an upper substrate U_SUB_1b. An etch-stop film 53b may be disposed on an uppermost insulating layer 52b, for example.

Figure 12:
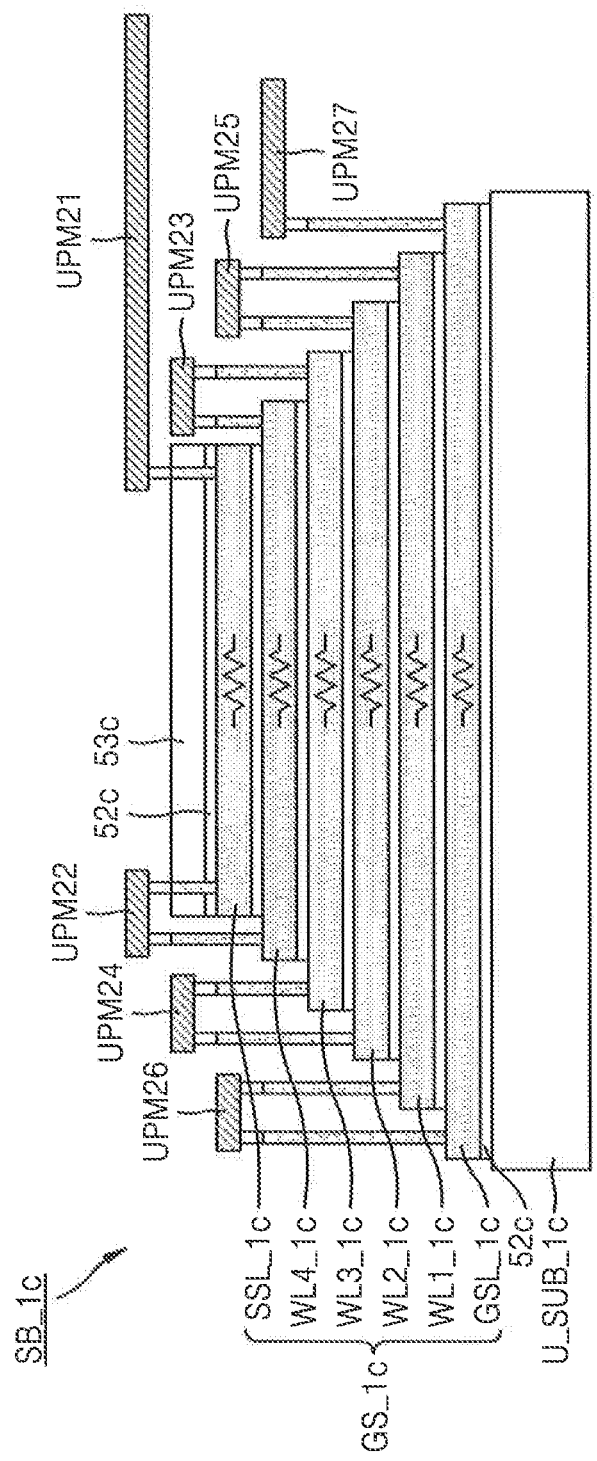
FIG. 12 is a cross-sectional view illustrating a partial block according to an exemplary embodiment of the inventive concept.

FIG. 12 is a cross-sectional view illustrating a partial block according to an exemplary embodiment of the inventive concept.

A configuration of a first partial block SB_1c of FIG. 12 is similar to a configuration of the first partial block SB_1 described with reference to FIGS. 5C and 7. However, in the present embodiment, pillars (e.g., P1 of FIG. 7) that pass through gate conductive layers GS_1c may not be formed in the first partial block SB_1c, and the gate conductive layers GS_1c may function as resistive elements. For example, when the gate conductive layers GS_1c are electrically connected through contacts and upper conductive lines UPM21 through UPM27 as shown in FIG. 12, conductive layers of the gate conductive layers GS_1c may constitute resistive elements that are connected in series. In an exemplary embodiment of the inventive concept, the first partial block SB_1c may be connected to a peripheral circuit (e.g., 150 of FIG. 10B) through the upper conductive lines UPM21 and UPM27 and a plurality of contacts that electrically connect the first partial block SB_1c and the upper conductive lines UPM21 and UPM27.

The gate conductive layers GS_1c may include a ground selection line GSL_1c, word lines WL1_1c through WL4_1c, and a string selection line SSL_1c on an upper substrate U_SUB_1c. An etch-stop film 53c may be disposed on an uppermost insulating layer 52c, for example.

Figure 13:
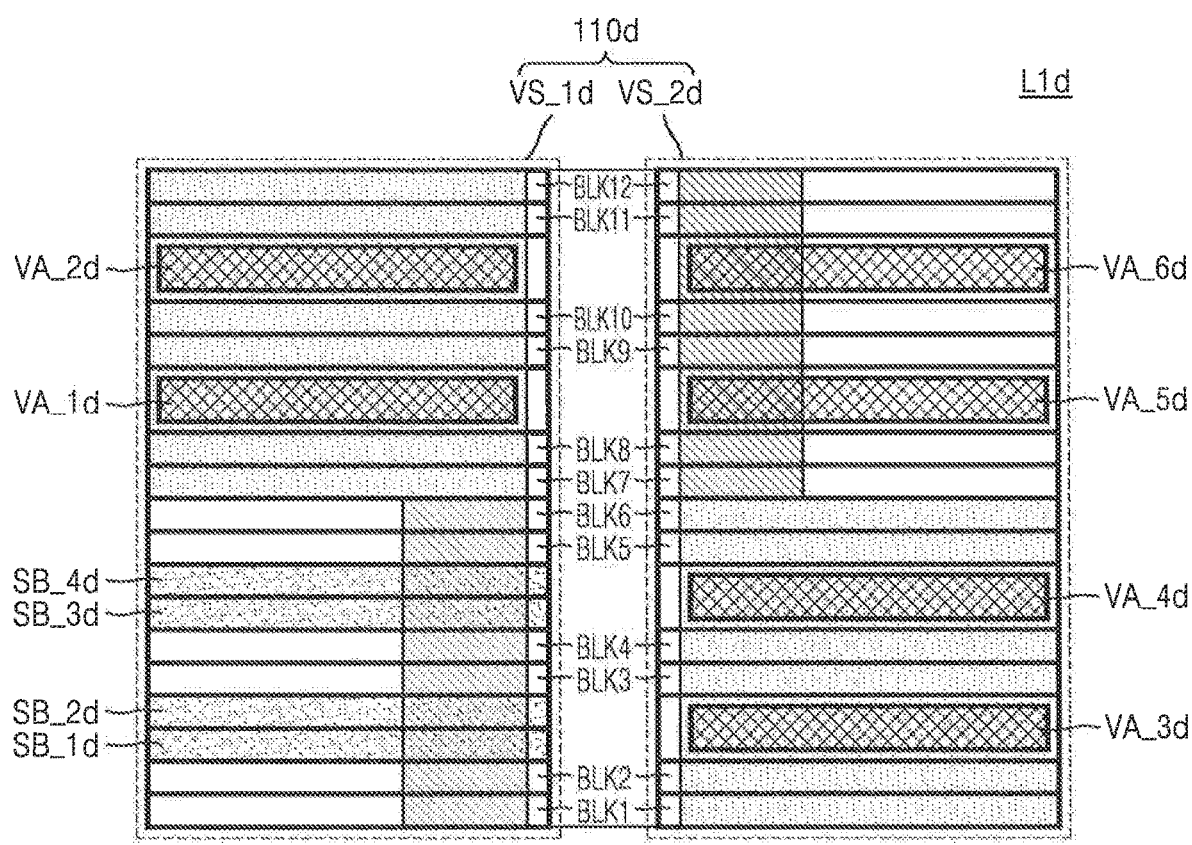
FIG. 13 is a plan view illustrating a top surface of the semiconductor layer according to an exemplary embodiment of the inventive concept.
Figure 13:
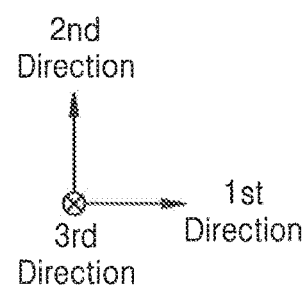

FIG. 13 is a plan view illustrating a top surface of a first semiconductor layer according to an exemplary embodiment of the inventive concept.

A configuration of a top surface of a first semiconductor layer L1d of FIG. 13 is similar to a configuration of a top surface of the first semiconductor layer L1 described with reference to FIG. 5C. However, in the present embodiment, a second vertical structure VS_2d may include a plurality of second via areas VA_3d through VA_6d, and first via areas VA_5d and VA_2d included in a first vertical structure may overlap the second via areas VA_5d and VA_6d in the first direction. In other words, only the first vertical structure VS_1d from among the first and second vertical structures VS_1d and VS_2d may include partial blocks SB_1d through SB_4d. Reference numeral 110d in FIG. 13 corresponds to a memory cell array.

Figure 14A:
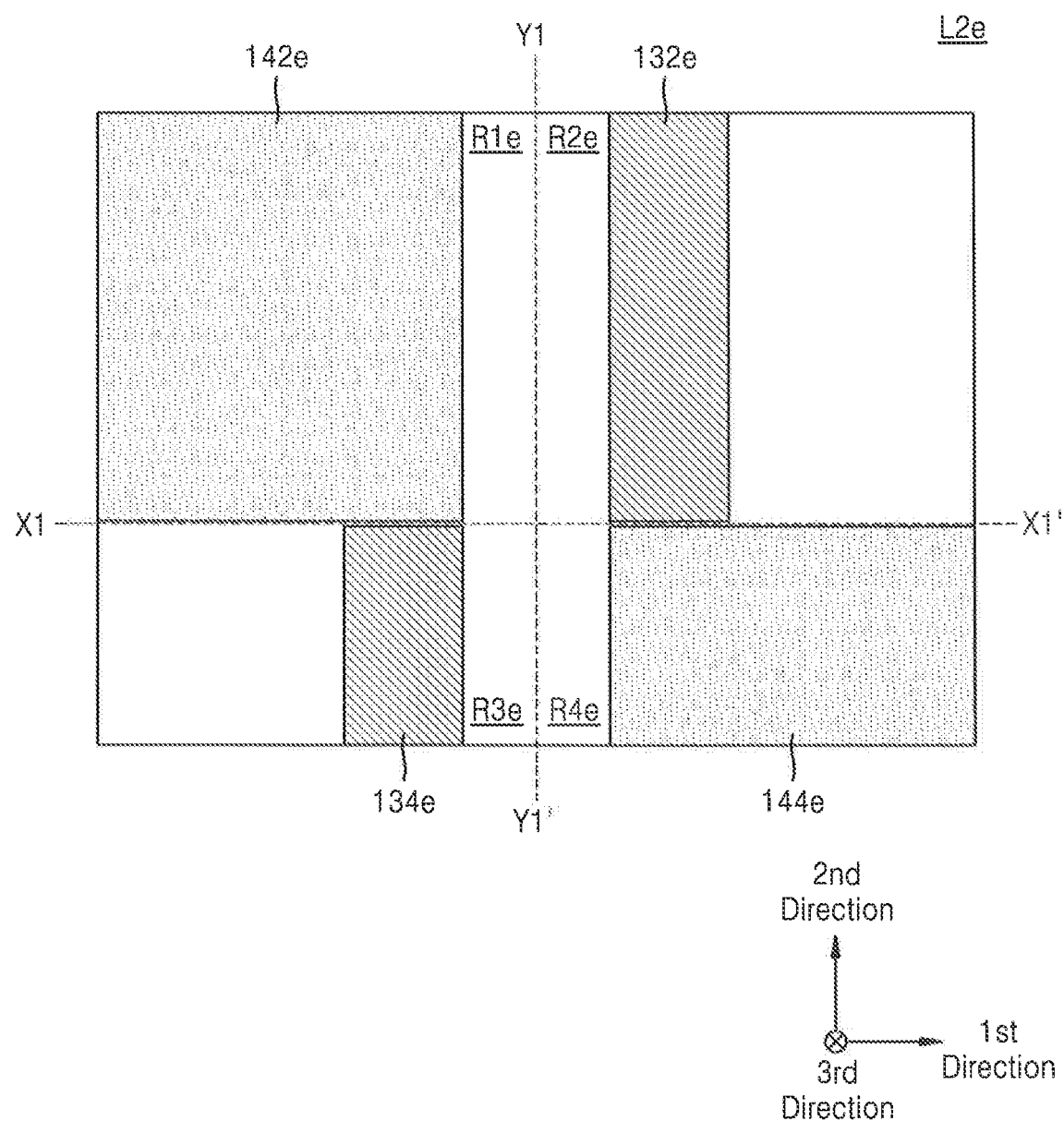
FIG. 14A is a plan view illustrating a top surface of the first semiconductor layer according to an exemplary embodiment of the inventive concept.
Figure 14B:
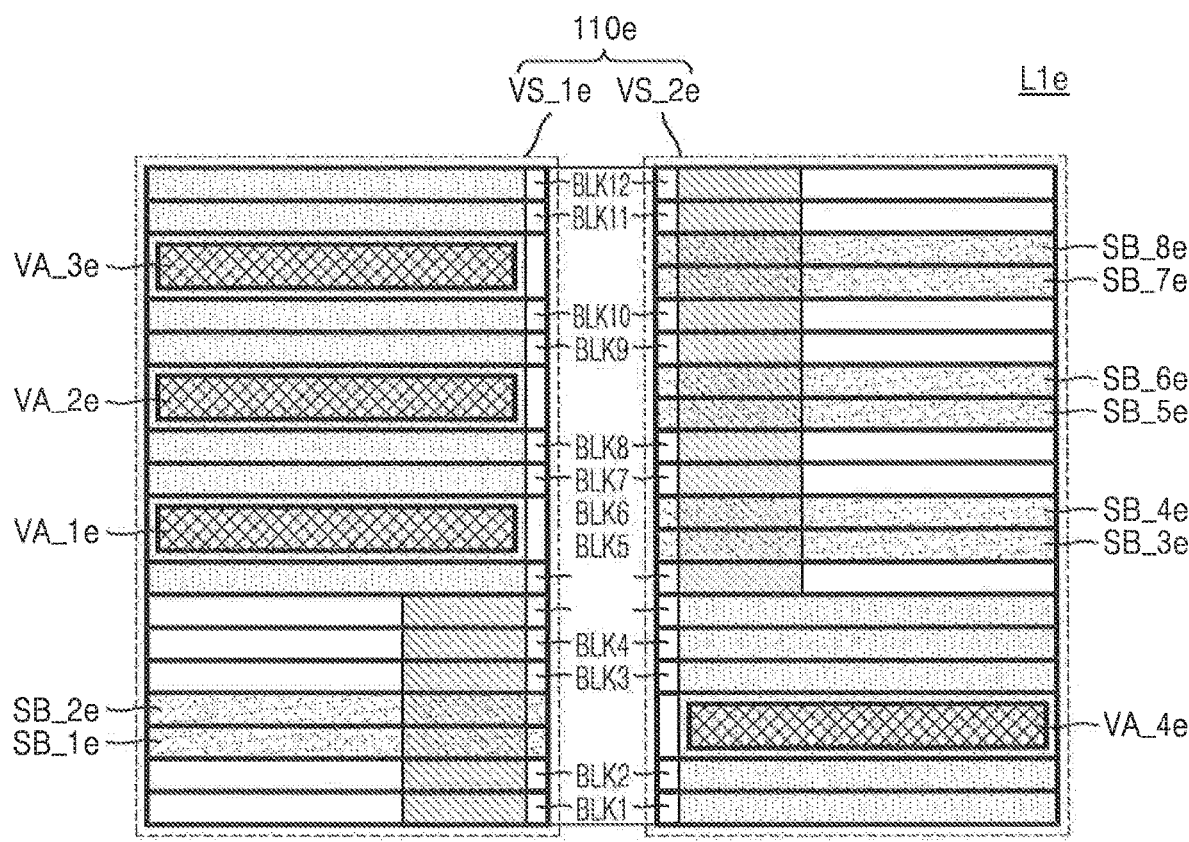
FIG. 14B is a plan view illustrating a top surface of the second semiconductor layer according to an exemplary embodiment of the inventive concept.

FIG. 14A is a plan view illustrating a top surface of a second semiconductor layer L2e according to an exemplary embodiment of the inventive concept. FIG. 14B is a plan view illustrating a top surface of a first semiconductor layer L1e according to an exemplary embodiment of the inventive concept. A repeated explanation of the same elements in FIGS. 5B and 5C will not be given in FIGS. 14A and 14B.

Referring to FIG. 14A, the second semiconductor layer L2e may be divided into first through fourth regions R1e through R4e a first virtual line X1-X1' of the first direction and a second virtual line Y1-Y1' of the second direction. In an exemplary embodiment of the inventive concept, areas of at least two regions from among the first through fourth regions. R1e through R4e may be different from each other. For example, areas of the first region R1e and the fourth region R4e may be different from each other. In addition, areas of the second region R2e and the third region R3e may be different from each other.

Accordingly, an area occupied by a first row decoder 132e on the second semiconductor layer L2e and an area occupied by a second row decoder 134e on the second semiconductor layer L2e may be different from each other. For example, the area, occupied by the first row decoder 132e on the second semiconductor layer L2c may be greater than the area occupied by the second row decoder 134e on the second semiconductor layer L2e.

In addition, an area occupied by the first page buffer 142e on the second semiconductor layer L2e and an area occupied by the second page buffer 144e on the second semiconductor layer L2e may be different from each other. For example, the area occupied by the first page buffer 142e on the second semiconductor layer L2e may be greater than the area occupied by the second page 144e on the second semiconductor layer L2e.

Referring to FIG. 14B, a memory cell array 110e may be located on the first semiconductor layer L1e, and may include a first vertical structure VS_1e and a second vertical structure VS_2e. As shown in FIG. 14B, the first vertical structure VS_1e may include a plurality of first partial blocks SB_1e and SB_2e and a plurality of first via areas VA_1e through VA_3e. In addition, the second vertical structure VS_2e may include a plurality of second partial blocks SB_3e through SB_8e and a second via area VA_4e. In other words, the number of partial blocks and via areas included in the first vertical structure VS_1e may be different from the number of partial blocks and via areas included in the second vertical structure VS_2e.

Figure 15:
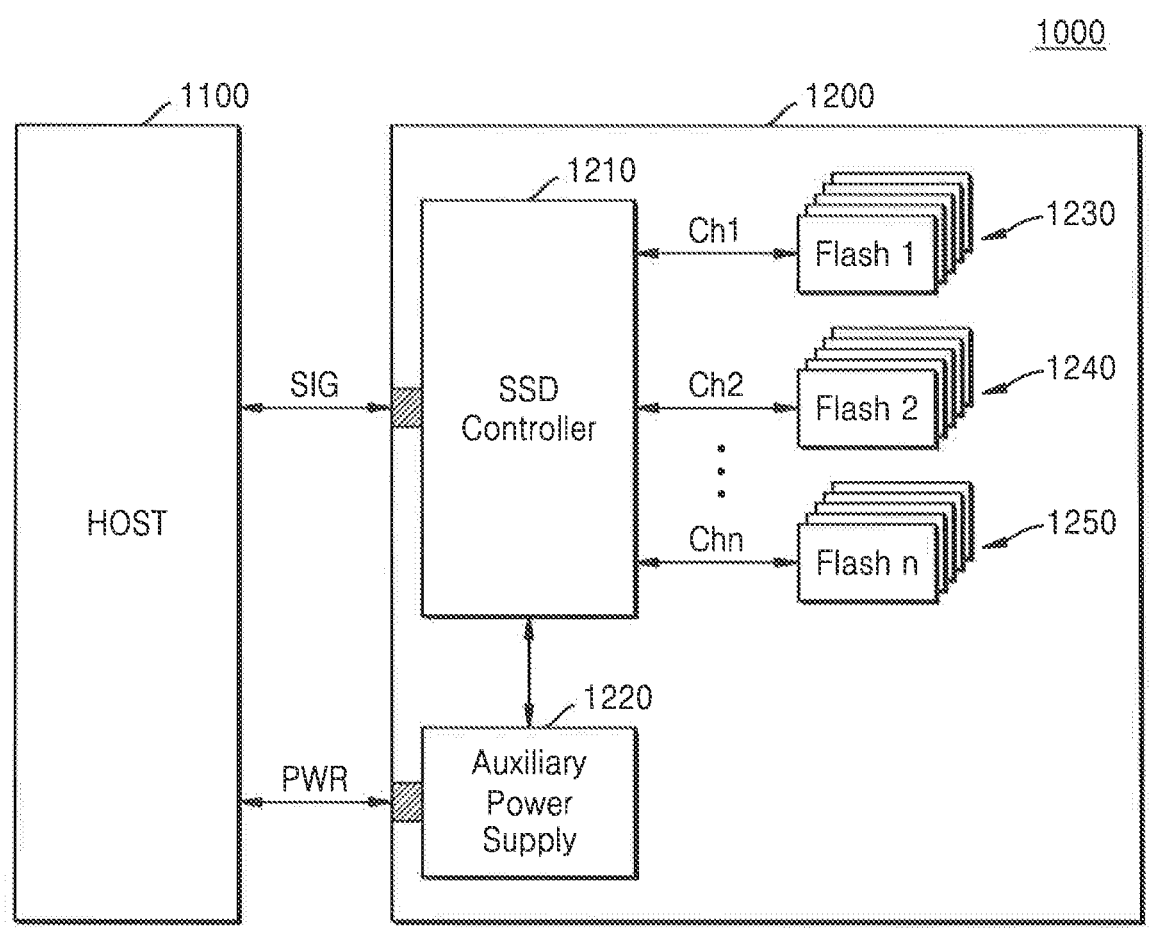
FIG. 15 is a block diagram of a solid-state drive (SSD) system including a memory device according to an exemplary embodiment of the inventive concept.

FIG. 15 is a block diagram of a solid-state drive (SSD) system 1000 including a memory device according to an exemplary embodiment of the inventive concept.

Referring to FIG. 15, the SSD system 1000 may include a host 1100 and an SSD 1200, The SSD 1200 may transmit/receive a signal SIG to/from the host 1100 through a signal connector, and may receive power PWR through a power connector.

The SSD 1200 may include an SSD controller 1210, an auxiliary power supply 1120, and a plurality of memory devices 1230, 1240, and 1250. The plurality of memory devices 1230, 1240, and 1250 each be a vertical stacked NAND flash memory device, and may be implemented as described with reference to FIGS. 1 through 14B. Accordingly, each of the memory devices 1230, 1240, and 1250 may have a high degree of integration.

While the inventive concept has been particularly shown and described with reference to exemplary embodiments thereof, it will be understood by one of ordinary skill in the art that various changes in form and details may be made therein without departing from the spirit and scope of the inventive concept as defined by the following claims.

What is claimed is:

1. A nonvolatile memory device, comprising:
a first semiconductor layer comprising a first upper substrate and a second upper substrate that are adjacent to each other in a first direction and a memory cell array that comprises first and second vertical structures, the first and second vertical structures comprising a plurality of channel layers that vertically extend from the first and second upper substrates and first and second gate conductive layers that are respectively stacked on the first and second upper substrates along side walls of the plurality of channel layers; and
a second semiconductor layer located under the first semiconductor layer in a vertical direction, the second semiconductor layer comprising a lower substrate that comprises a plurality of row decoder circuits and a plurality of page buffer circuits,
wherein the first vertical structure further comprises a first through-hole via that passes through the first vertical structure and is connected to a first page buffer circuit, and
the second vertical structure further comprises a first partial block, wherein the first partial block overlaps a first via area in the first direction and comprises an edge region electrically connected to a first row decoder circuit.

2. The nonvolatile memory device of claim 1, wherein at least one of the plurality of channel layers is located in the first partial block.

3. The nonvolatile memory device of claim 1, wherein the second semiconductor layer comprises first, second, third and fourth regions that are divided along the first and second directions at a point overlapping the memory cell array in the third direction,
wherein the first and second regions are adjacent to each other in the first direction, and the second and third regions are adjacent to each other in the second direction,
wherein the first page buffer circuit is located in the first region and a second page buffer circuit is located in the third region.

4. The nonvolatile memory device of claim 3, wherein the plurality of row decoder circuits comprise first and second row decoder circuits respectively located in the second and fourth regions, and the first partial block is electrically connected to the second row decoder circuit.

5. The nonvolatile memory device of claim 4, further comprising a control circuit configured to control the second row decoder circuits to access the first partial block.

6. The nonvolatile memory device of claim 1, wherein the second vertical structure further comprises a second via area in which a second through-hole via is provided, wherein the second through-hole via passes through the second vertical structure and connects a second bit line and a second page buffer circuit, wherein the first vertical structure further comprises a second partial block, wherein the second partial block overlaps the second via area in the first direction.

* * * * *